(12) United States Patent
Yamazaki et al.

(10) Patent No.: US 7,764,012 B2
(45) Date of Patent: Jul. 27, 2010

(54) LIGHT EMITTING DEVICE COMPRISING REDUCED FRAME PORTION, MANUFACTURING METHOD WITH IMPROVE PRODUCTIVITY THEREOF, AND ELECTRONIC APPARATUS

(75) Inventors: Shunpei Yamazaki, Setagaya (JP); Mitsuaki Osame, Atsugi (JP); Jun Koyama, Sagamihara (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 796 days.

(21) Appl. No.: 11/099,654

(22) Filed: Apr. 6, 2005

(65) Prior Publication Data

US 2005/0231107 A1  Oct. 20, 2005

(30) Foreign Application Priority Data

Apr. 16, 2004 (JP) .............................. 2004-121121

(51) Int. Cl.
*H01J 1/62* (2006.01)
*H01J 63/04* (2006.01)
*G09G 3/10* (2006.01)
*H05B 33/00* (2006.01)

(52) U.S. Cl. ................ 313/503; 313/504; 313/498; 313/506; 313/500; 313/512; 315/169.3

(58) Field of Classification Search ......... 313/498–512; 315/169.1, 169.3; 428/690–691, 917; 438/26–29, 438/34, 82; 527/40, 72, 98–100, 642–643, 527/759; 427/66, 532–535, 539
See application file for complete search history.

(56) References Cited

U.S. PATENT DOCUMENTS 5,882,761 A    3/1999  Kawami et al.

| | | | |
|---|---|---|---|
| 6,072,272 A | * | 6/2000 | Rumbaugh ................ 313/470 |
| 6,284,342 B1 | | 9/2001 | Ebisawa et al. |
| 6,365,917 B1 | | 4/2002 | Yamazaki |

(Continued)

FOREIGN PATENT DOCUMENTS

EP          0 776 147 A1       5/1997

(Continued)

OTHER PUBLICATIONS

Office Action (Chinese Application No. 200510065269.9) dated Sep. 5, 2008.

*Primary Examiner*—Sikha Roy
*Assistant Examiner*—Jose M Diaz
(74) *Attorney, Agent, or Firm*—Eric J. Robinson; Robinson Intellectual Property Law Office, P.C.

(57) ABSTRACT

Further reduction in frame portion is achieved in the case where a driver circuit and a pixel portion are formed on a common substrate. Also, a light emitting device is provided with an advantageous structure for obtaining a large number of panels by use of a large substrate, whereby the number of panels taken out from a substrate can be increased, leading to better productivity. According to the invention, a terminal electrode is provided in the position overlapping a peripheral circuit portion, and the terminal electrode is connected to an FPC with an anisotropic conductive adhesive material. In addition, a covering material is firmly fixed by using a sealant that is in contact with the edge and periphery of a substrate.

22 Claims, 14 Drawing Sheets

U.S. PATENT DOCUMENTS

| | | | |
|---|---|---|---|
| 6,366,025 B1 | 4/2002 | Yamada | |
| 6,777,887 B2 * | 8/2004 | Koyama | 315/169.3 |
| 6,798,132 B2 * | 9/2004 | Satake | 313/495 |
| 6,919,681 B2 * | 7/2005 | Cok et al. | 313/500 |
| 6,992,439 B2 * | 1/2006 | Yamazaki et al. | 313/512 |
| 7,101,242 B2 * | 9/2006 | Fukunaga et al. | 445/23 |
| 7,102,281 B2 * | 9/2006 | Choi et al. | 313/504 |
| 7,112,115 B1 * | 9/2006 | Yamazaki et al. | 445/25 |
| 7,128,632 B2 * | 10/2006 | Nakamura | 445/25 |
| 7,576,485 B2 | 8/2009 | Ohtani | |
| 2002/0180371 A1 * | 12/2002 | Yamazaki et al. | 315/169.3 |
| 2003/0027369 A1 * | 2/2003 | Yamazaki | 438/21 |
| 2003/0117068 A1 * | 6/2003 | Forrest et al. | 313/504 |
| 2003/0132716 A1 * | 7/2003 | Yamazaki et al. | 315/169.3 |
| 2003/0137325 A1 * | 7/2003 | Yamazaki et al. | 327/80 |
| 2004/0169786 A1 * | 9/2004 | Yamazaki et al. | 349/61 |
| 2004/0217694 A1 * | 11/2004 | Cok et al. | 313/504 |
| 2005/0006625 A1 * | 1/2005 | Seo et al. | 252/301.16 |
| 2005/0040762 A1 * | 2/2005 | Kurihara | 313/512 |
| 2005/0057151 A1 * | 3/2005 | Kuwabara | 313/506 |
| 2005/0206308 A1 * | 9/2005 | Takahashi et al. | 313/504 |
| 2005/0218792 A1 * | 10/2005 | Jianpu et al. | 313/502 |
| 2006/0082300 A1 * | 4/2006 | Yamazaki et al. | 313/512 |
| 2006/0083943 A1 * | 4/2006 | Maxted et al. | 428/690 |

FOREIGN PATENT DOCUMENTS

| | | |
|---|---|---|
| JP | 09-148066 | 6/1997 |
| JP | 2001-203076 | 7/2001 |

* cited by examiner

LIGHT EMITTING DEVICE COMPRISING REDUCED FRAME PORTION, MANUFACTURING METHOD WITH IMPROVE PRODUCTIVITY THEREOF, AND ELECTRONIC APPARATUS

BACKGROUND OF THE INVENTION

1. Field of the Invention

The present invention relates to an organic light emitting element comprising an anode, a cathode and a layer containing an organic compound that can obtain light emission when an electric field is applied thereto (hereinafter referred to as an "organic compound layer", an "electroluminescent layer" or an "EL layer"), and a light emitting device using such an organic light emitting element. For example, the invention relates to an electronic apparatus mounting as its component a light emitting device that includes an organic light emitting element.

Note that the light emitting device in this specification refers to an image display device, a light emitting device or a light source (including a lighting system). In addition, a module where a connector such as a Flexible Printed Circuit (hereinafter referred to as a FPC), a TAB (Tape Automated Bonding) tape and a TCP (Tape Carrier Package) is attached to a light emitting device, a module where an end of a TAB tape or a TCP is provided with a FPC, and a module where ICs (Integrated Circuits) are directly mounted on light emitting elements by COG (Chip On Glass) bonding all fall within the category of the light emitting device.

2. Description of the Related Art

In recent years, researches of a light emitting device using an EL element as a luminous element have been actively developed and in particular, a light emitting device using an organic material as an EL material is attracting attentions. Such a light emitting device is also referred to as an EL display.

Note that the EL element comprises an anode, a cathode and an organic compound layer (EL layer) that is capable to generate luminescence (Electroluminescence) when an electronic field is applied thereto.

Since a light emitting device is a luminous type unlike a liquid crystal display device, it has no problems concerning the viewing angle. That is, it is more suitable for outdoor use than a liquid crystal display, and uses of various styles thereof have been proposed.

An EL element has a structure where an EL layer is sandwiched by a pair of electrodes, and the EL layer generally has a stacked-layer structure. Typically, a sequentially stacked-layer structure of "a hole transporting layer, a light emitting layer, and an electron transporting layer" is employed. This structure can provide quite high luminous efficiency, and is adopted for most of the light emitting devices that are under research and development currently. It is said that an EL element can emit light when an electric field is applied to a pair of the electrodes that sandwiches an organic compound layer, which causes electrons injected from the cathode and holes injected from the anode to be recombined in the luminescence center of the organic compound layer to form molecular excitons, and the molecular excitons release energy in returning to the ground state, and then emit a light. As an excited state, an excited singlet state and an excited triplet state are known, and it is considered that light emission can be obtained through either of the excited states.

In addition, a light emitting element formed of a cathode, an EL layer and an anode is referred to as an EL element, and there are two types of a light emitting device that uses such an EL element: a light emitting device where an EL layer is formed between two types of striped electrodes that are provided crosswise (passive matrix method); and a light emitting device where an EL layer is formed between a pixel electrode that is connected to a TFT and arranged in matrix, and an opposite electrode (active matrix method). However, when the pixel density is increased, the active matrix method, in which a switch is provided per pixel (or per dot), is considered advantageous as it enables low voltage drive.

An EL material that forms an EL layer deteriorates quite easily resulting from oxidation or moisture absorption due to oxygen or moisture, which leads to a luminance decay or shorter life of the light emitting element.

Display devices having a structure against such deterioration of the EL element have been developed. There is a method in which EL elements are put in an airtight container to shut the EL elements in an airtight space and block out the outside air, and a drying agent is provided separately from the EL elements (see Patent Document 1, for example).

Alternatively, there is a method in which a sealant is formed on an insulator where EL elements are formed, and the airtight space, which is surrounded by a covering material and the sealant with the use of the sealant, is filled with a filling material to block out the outside air (see Patent Document 2, for example).

[Patent Document 1] Japanese Patent Laid-Open No. Hei 9-148066

[Patent Document 2] Japanese Patent Laid-Open No. Hei 13-203076

In order to advance reduction in manufacturing cost of a light emitting device, integral formation of a driver circuit and a pixel portion on a common substrate has been promoted.

When a pixel portion and a driver circuit for controlling the pixel portion are integrally formed on a common substrate, a frame portion that is the region other than the pixel region tends to occupy a larger area as compared to the case of mounting a driver circuit by TAB. In order to reduce the area of the frame portion, a circuit scale of the driver circuit is required to be reduced. In particular, a portable phone that incorporates a small-sized display panel with a screen size of 5 inches or less requires further reduction of the frame portion.

SUMMARY OF THE INVENTION

In view of the foregoing, it is an object of the invention to achieve further reduction in frame portion.

It is another object of the invention to provide a highly reliable light emitting device and a manufacturing method thereof where oxygen or moisture can be blocked out before reaching light emitting elements. It is still another object of the invention to provide a light emitting device that has an advantageous structure for obtaining a large number of panels by use of a large-sized substrate, whereby the number of panels that can be taken out from a substrate can be increased, which leads to better productivity.

According to the invention, a terminal electrode is provided in the position overlapping a driver circuit portion, and the terminal electrode is connected to a FPC with an anisotropic conductive adhesive material. That is, although a driver circuit and a terminal electrode have been disposed in separate space conventionally, the terminal electrode is disposed in the space where the driver circuit is formed according to the invention, whereby reduction in frame portion is achieved.

Since the terminal electrode is formed in the same step as a first electrode of a light emitting element, it can be provided without increasing the number of steps. In addition, an insulating film or stacked layers of insulating films are provided between TFTs of the driver circuit and the terminal electrode so that a circuit such as TFTs disposed in the driver circuit is not broken by the compression bonding of the FPC.

In addition, according to the invention, a light emitting device is provided with an advantageous structure for obtaining a large number of panels by use of a large substrate, whereby the number of panels that can be taken out from a substrate can be increased, which leads to better productivity. After a substrate is segmented into each display panel portion, a covering material is firmly fixed by using a sealant that is in contact with the edge and periphery of the substrate. Since the covering material is firmly fixed by using the sealant that is in contact with the edge and periphery of the substrate, the distance between the pixel portion and the edge of the substrate, namely the frame portion can be reduced.

In addition, since the edge of the substrate is rougher as compared to a polished surface, and thus is highly adhesive, the width of the sealant on the periphery of the substrate can be further reduced. Increase in the adhesion between the covering material and the substrate leads to the improvement of reliability of the light emitting device.

According to such a structure, spacing between scribe lines for segmenting a large substrate can be narrowed, thus the number of panels taken out from a substrate can be increased. Increase in the number of panels taken out from a substrate leads to a reduction in manufacturing cost of one panel.

According to one structure of the invention disclosed in this specification, a light emitting device is provided where a pixel portion comprising a plurality of light emitting elements each including stacked layers of a first electrode, an organic compound layer over the first electrode and a second electrode over the organic compound layer, and a driver circuit portion are formed between a substrate and a covering material. Over the driver circuit portion, a terminal electrode formed of the same material as the first electrode is provided over the driver circuit portion, and the terminal electrode is connected to a FPC.

According to another structure of the invention, a light emitting device is provided where a pixel portion comprising a plurality of light emitting elements each including stacked layers of a first electrode, an organic compound layer over the first electrode and a second electrode over the organic compound layer, and a driver circuit portion are formed between a substrate and a covering material. Over the driver circuit portion, a terminal electrode formed of the same material as the first electrode is provided, the terminal electrode is connected to a FPC, and end portions of a sealant and the covering material are disposed over the driver circuit portion. The covering material is fixed on the edge and periphery of the substrate with the sealant, and the covering material partially covers the edge of the substrate.

According to each of the aforementioned structures, a drying agent is disposed in the airtight space surrounded by the sealant.

Also, in a full color light emitting device, when the reliability of each light emitting element for RGB (R; red, G; green, B; blue) differs from each other, the light emitting area of a light emitting element that has lower reliability than other light emitting elements is increased. For example, by increasing the light emitting area of the blue light emitting element in order to decrease the current density of the blue light emitting element that has lower reliability than other light emitting elements, the reliability of the light emitting device is improved. Note that it is desirable that the width of a bank be also reduced in order to increase the light emitting area of the blue light emitting element.

According to another structure of the invention disclosed in this specification, a light emitting device is provided where a pixel portion comprising a plurality of light emitting elements each including stacked layers of a first electrode, an organic compound layer over the first electrode and a second electrode over the organic compound layer is formed between a substrate and a covering material. The light emitting elements include three kinds of light emitting elements for red, green and blue color, and a first electrode of the blue light emitting element has a larger area than those of the other light emitting elements.

According to such a structure, three kinds of the light emitting elements for red, green and blue color can have substantially the same reliability, whereby color deviation with the passage of time can be prevented in full color display.

In addition, in each of the aforementioned structures, the covering material has a shape that partially covers an edge of the substrate. Note that in this specification, "to cover" means the condition where an edge of the substrate is partially covered or totally covered as the covering material wraps the end of the substrate.

According to the sealing structure and the element structure of the invention, reliability of a light emitting device can be improved significantly.

DETAILED DESCRIPTION OF THE PREFERRED EMBODIMENTS

Description is made below on Embodiment Modes of the invention.

Embodiment Mode 1

Figures 1A, 1B:
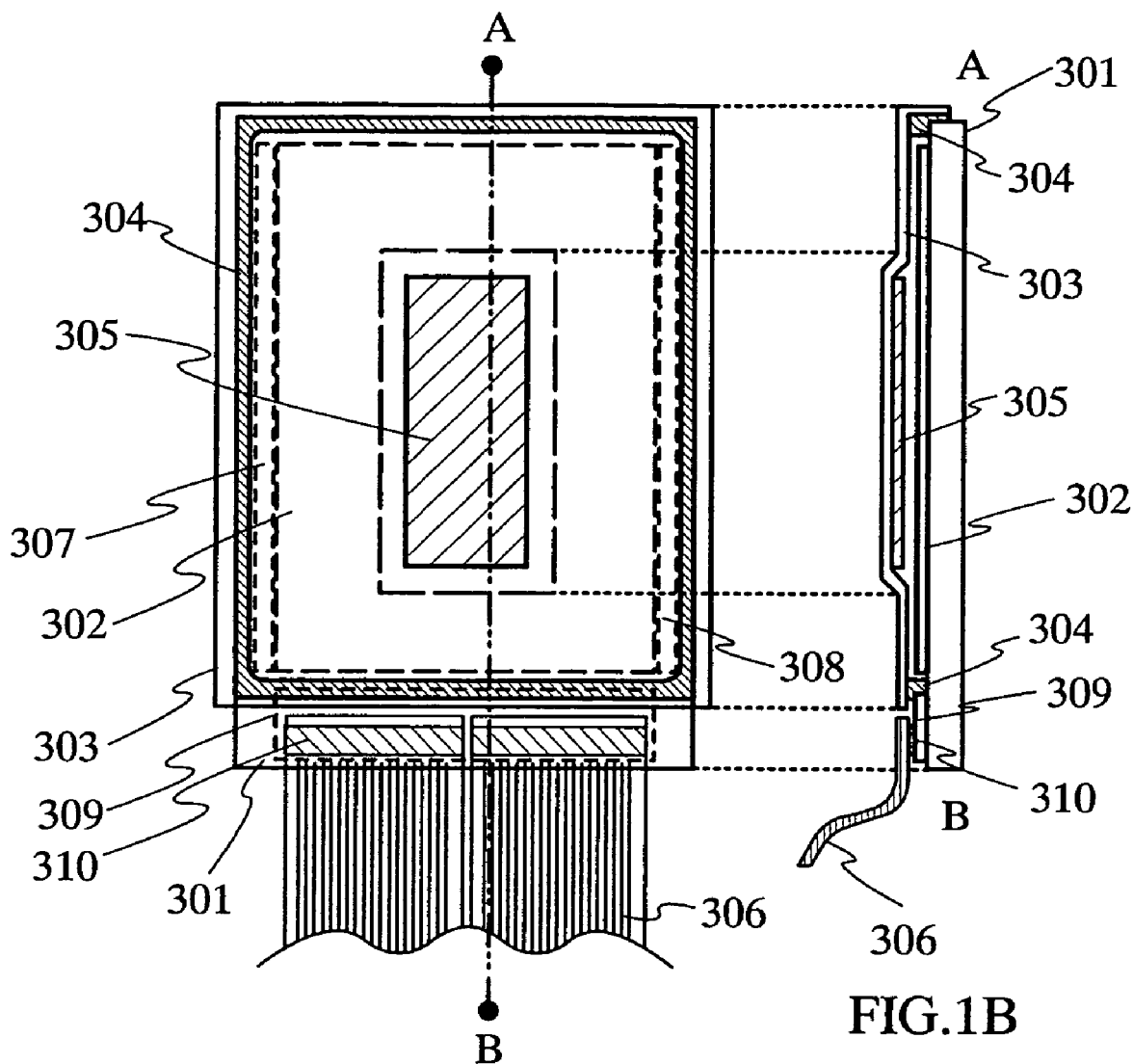
FIGS. 1A and 1B illustrate a top view and a cross-sectional view of a light emitting device respectively (Embodiment Mode 1).

FIGS. 1A and 1B illustrate an example of a connection structure between a light emitting device and an FPC, and a sealing structure of the light emitting device respectively.

FIG. 1A is a top view of a light emitting device, and FIG. 1B is a cross-sectional view along a chain line A-B in FIG. 1A.

As shown in FIGS. 1A and 1B, according to the invention, a pixel portion 302 and a peripheral circuit portion 309 are formed on a common substrate, and a terminal electrode 310 for connection to an FPC 306 is provided above TFTs of the peripheral circuit portion. By disposing the terminal electrode 310 in the space where the peripheral circuit portion 309 is disposed, reduction in frame portion can be achieved.

In addition, since a covering material 303 is firmly fixed by use of a sealant 304 that is in contact with an edge and periphery of the substrate, the distance between the pixel portion 302 and the edge of the substrate, namely the frame portion can be further reduced. Note that in the pixel portion 302, light emitting elements each having an organic compound layer are arranged in matrix. Peripheral circuit portions 307, 308 and 309 are constructed by TFTs and the like.

Here, the pixel portion 302 including light emitting elements is sealed by using the covering material 303 having a shape shown in FIGS. 1A and 1B. The material of the covering material 303 is not specifically limited as long as it has a barrier property against moisture, and it may be formed of a substrate of any compositions, for example, such as W, Ni, Al, metal (e.g., stainless), glass, plastic and ceramics. Alternatively, the surface of such substrate may be coated with an inorganic insulating film such as a $SiN_X$ film, a $SiN_XO_Y$ film, an $AlN_X$ film and an $AlN_XO_Y$ film to obtain a barrier property. Here, a sealing can that is formed of a metal is used as the covering material 303, and light emitted from the light emitting elements is obtained through a substrate 301 having a light transmittance state.

The covering material 303 has a shape that covers three sides of the substrate 301, and in the three sides, the sealant 304 is provided on the edge of the substrate, whereby a space surrounded by the sealant is sealed hermetically. In order to mount the FPC 306, the surface of the substrate and the covering material are firmly fixed with a sealant in the remaining one side, where the width of the sealant is thicker as compared to the other three sides when it is seen from the top. In the other three sides, the sealant 304 is provided on the edge of the substrate, and the distance between the interface between the outside air and the sealant and the interface between the airtight space and the sealant is secured sufficiently. The internal airtight space that is surrounded by the sealant 304 is filled with a nitrogen gas, and a slight amount of moisture therein is removed by a drying agent 305, whereby a sufficiently dried space is obtained.

In addition, since the edge of the substrate 301 is rough as compared to the polished surface, which is thus highly adhesive, the width of the sealant can be further reduced.

Further, by providing the sealant 304 on the edge of the substrate, the distance between the pixel portion 302 and the edge of the substrate, namely the frame portion can be reduced even when the pixel portion 302 and the peripheral circuit portions 307, 308 and 309 are all formed on the substrate 301

In addition, if necessary, integration may be carried out by mounting IC chips (a memory chip, a CPU chip, a power circuit chip and the like) on the open space or on the FPC.

Figure 2A:
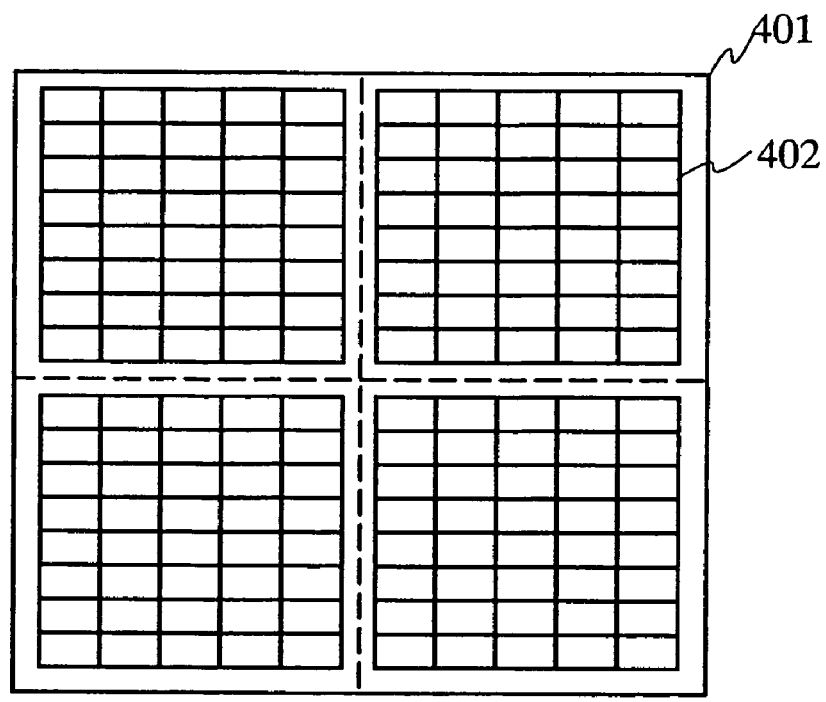
FIGS. 2A to 2C illustrate manufacturing steps of a light emitting device that enables a large number of panels to be taken out from a substrate (Embodiment Mode 1).
Figure 2B:
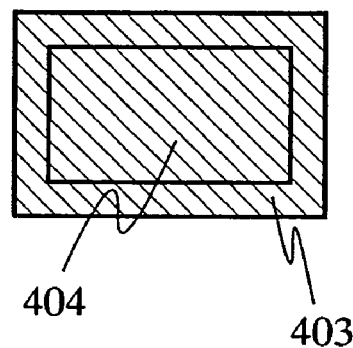
Figure 2C:
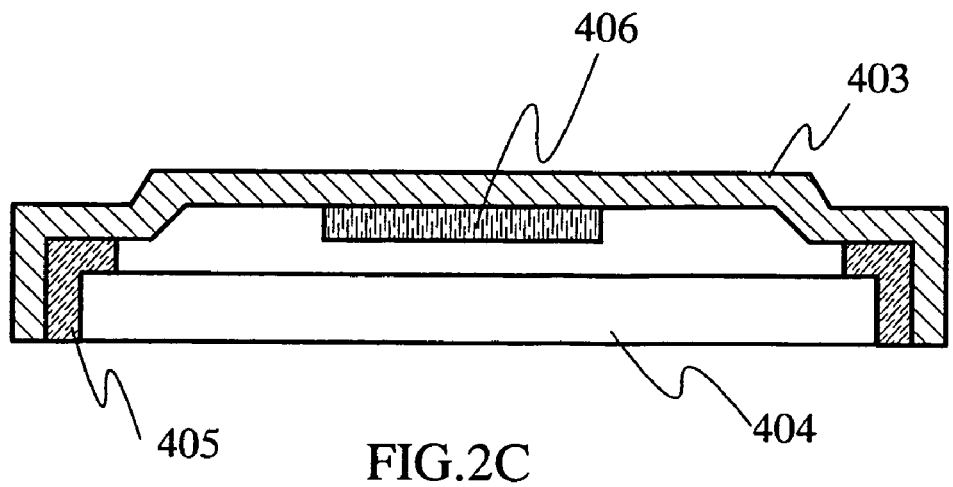

FIGS. 2A to 2C illustrate exemplary sequence of the manufacturing steps.

First, a plurality of panel regions 402 each comprising TFTs and light emitting elements are provided on a large substrate to form an active matrix substrate 401 (FIG. 2A). Note that the panel region 402 is the region to be one panel that includes at least a pixel portion.

Then, segmentation is carried out per pixel portion to obtain a substrate 404, and each of the substrates is sealed with a covering material 403 (FIG. 2B). FIG. 2C illustrates a cross-sectional view of the substrate after being sealed. As shown in FIG. 2C, the edge of the substrate is provided with a sealant 405 to fix the covering material 403. In FIG. 2C, the edge of the covering material 403, the back side of the substrate 404, and the exposed (outside) face of the sealant 405 form the substantially linear outer edge. The internal airtight space surrounded by the sealant 405 is removed of its slight amount of moisture by the drying agent 406, and thus is sufficiently dried.

According to the sequence as described above, a light emitting device can be provided with an advantageous structure for obtaining a large number of panels by use of a large substrate. According to the invention, the width of the sealant on the periphery of the substrate can be reduced, whereby a larger number of panels that can be taken out from one substrate can be increased.

Figure 3A:
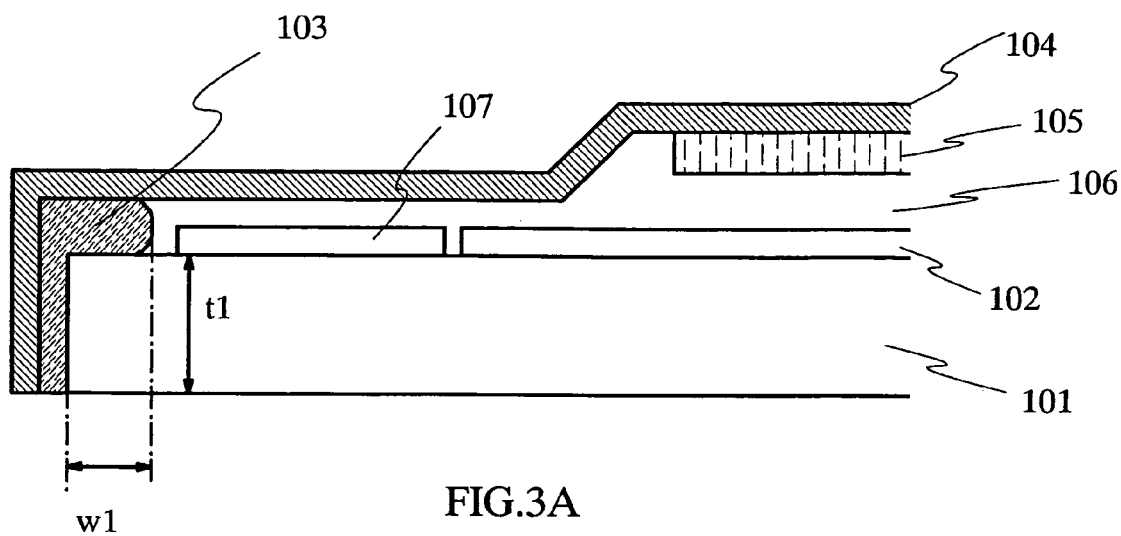
FIGS. 3A and 3B illustrate cross-sectional views of an edge of a light emitting device (Embodiment Mode 1).

FIG. 3A illustrates an exemplary cross-sectional view of an end portion of the light emitting device of the invention (end portion of a substrate that is covered with a covering material).

In FIG. 3A, a pixel portion 102 and a peripheral circuit portion 107 are formed on a substrate 101, which is covered with a covering material 104. As shown in FIG. 3A, the covering material 104 is firmly fixed by use of a sealant 103 that is in contact with the edge and periphery of the substrate 101, therefore, the distance between the pixel portion 102 and the edge of the substrate, namely the frame portion can be reduced. Note that in the pixel portion 102, light emitting elements each having an organic compound layer are arranged in matrix.

In addition, since the light emitting elements are weak against moisture, a drying agent is disposed in an airtight space 106 that is surrounded by the substrate 101, the covering material 104 and the sealant 103. Note that the airtight space 106 is filled with a dry inert gas. The internal airtight space 106 that is surrounded by the sealant 103 is removed of its slight amount of moisture by a drying agent 105, and thus is dried sufficiently.

As the drying agent 105, substances that absorb moisture by chemical adsorption such as an oxide of an alkaline earth metal (e.g., calcium oxide and barium oxide) may be used. Alternatively, substances that absorb moisture by physical adsorption such as zeolite and silica gel may be used as other drying agents.

For example, if a sealant with a total width of 2 mm (width at the fixing time) is required for sealing, and a thickness t1 of the substrate is set at 0.7 mm to firmly attach the edge and periphery of the substrate, the total width of 2 mm can be obtained by setting a width w1 of the sealant 103 on the periphery of the substrate at 1.3 mm.

As the sealant 103 in contact with the edge and periphery of the substrate, an ultraviolet light curable resin, a heat curable resin, a silicone resin, an epoxy resin, an acrylic resin, a polyimide resin, a phenol resin, PVC (polyvinyl chloride), PVB (polyvinyl butyral) or EVA (Ethylene vinyl acetate) may be used. Alternatively, the sealant may be a material added with a filler (spacer in bar form or fiber form), or may be a material added with a spherical spacer.

Figure 3B:
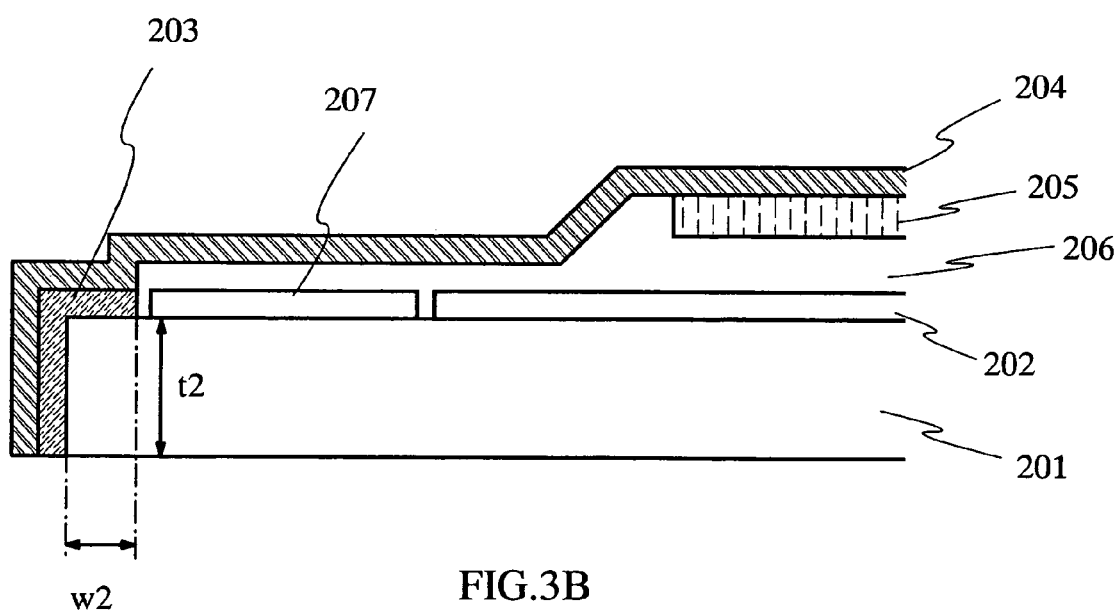

FIG. 3B illustrates another exemplary cross-sectional view of an end portion of the light emitting device of the invention. Note that FIG. 3B is different from FIG. 3A in the shape of the covering material. In addition, similarly to FIG. 3A, an internal airtight space 206 surrounded by a sealant 203 is removed of its slight amount of moisture by a drying agent 205, and thus is dried sufficiently.

In FIG. 3B, a pixel portion 202 and a peripheral circuit portion 207 are formed on a substrate 201, which is covered with a covering material 204. By adjusting the shape of the covering material to match the edge of the substrate, the side face of the sealant 203 and the surface of the substrate can have a uniform thickness. Even if the peripheral circuit portion 207 constructed by a driver circuit, a protection circuit and the like is provided, the distance between the pixel portion 202 and the edge of the substrate, namely the frame portion can be reduced.

For example, if a sealant with a total width of 1.5 mm (width at the fixing time) is required for sealing, and a thickness t2 of the substrate is set at 0.5 mm to firmly attach the edge and periphery of the substrate, the total width of 1.5 mm can be obtained by setting a width w2 of the sealant 203 on the periphery of the substrate at 1 mm.

The shape of the covering material is not specifically limited to the shapes shown in FIGS. 3A and 3B as long as it has a shape that covers the edge of the substrate. For example, a covering material with an across-sectioned horseshoe shape that covers the edge of the substrate, specifically such that end portions of the covering material reach the back side of the substrate may be used. In that case, the sealant is in contact with not only the edge but also a portion of the back side of the substrate.

According to the invention, a light emitting device can be manufactured efficiently by using a large substrate having a sized of, for example, 320 nm×400 mm, 370 mm×470 mm, 550 mm×650 mm, 600 mm×720 mm, 680 mm×880 mm, 1000 mm×1200 mm, 1100 mm×1250 mm or 1150 mm×1300 mm. In addition, when obtaining a large number of panels by using a large substrate, the manufacturing steps are as follows: a substrate is segmented per pixel portion; and then a covering material is firmly fixed on each of the substrates with a sealant.

Figure 4:
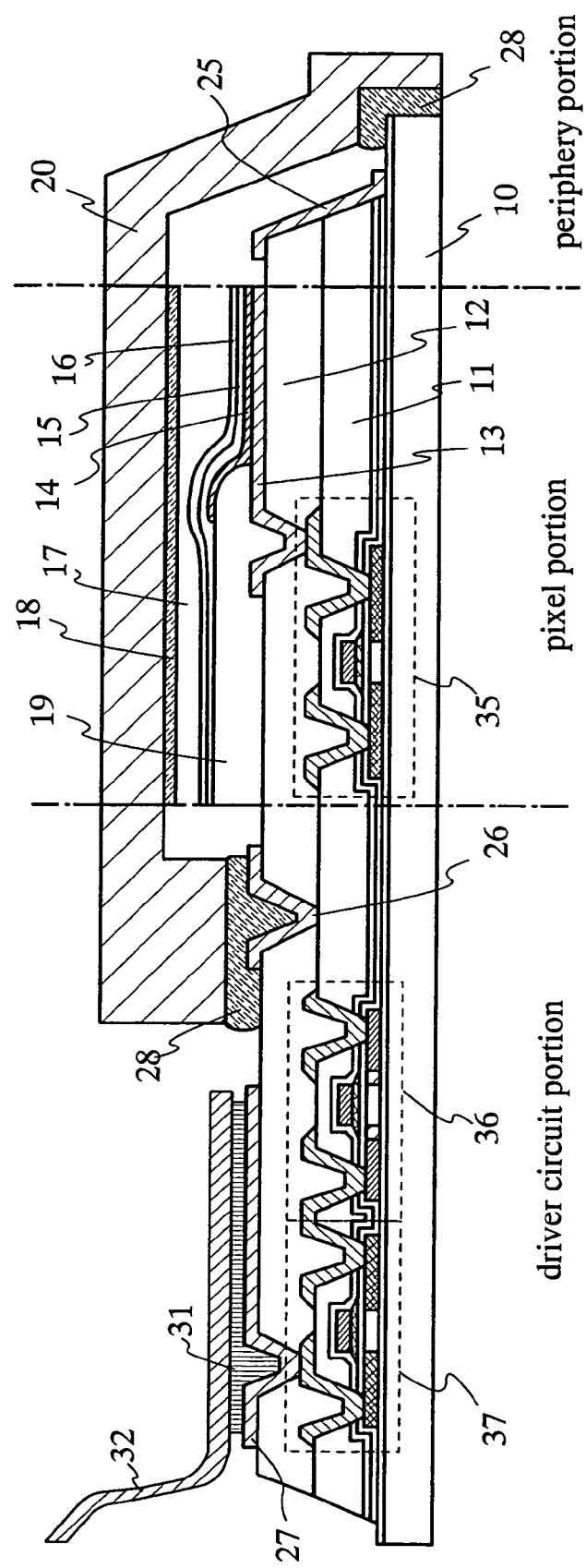
FIG. 4 illustrates a cross-sectional view of an EL display device (Embodiment Mode 1).

FIG. 4 illustrates an exemplary cross-sectional structure that clearly shows the positional relationship between TFT's and a light emitting element.

Description is made briefly on the manufacturing steps of the light emitting device shown in FIG. 4.

First, a base insulating film is formed over a substrate 10, and then each semiconductor layer is formed thereon. Subsequently, a gate insulating film is formed covering the semiconductor layer, and each gate electrode is formed.

Then, source and drain region, and if necessary, LDD regions are formed by doping N-type impurity elements (typically, phosphorous or As) in the semiconductor layer in order to form an N-channel TFT 36, and by doping P-type impurity elements (typically, boron) in the semiconductor layer in order to form P-channel TFTs 35 and 37.

Then, a first interlayer insulating film and a second interlayer insulating film 11 are formed. The first interlayer insulating film is formed of an inorganic material (silicon oxide, silicon nitride, silicon oxynitride or the like) that is obtained by PCVD. The second interlayer insulating film 11 is formed of an inorganic material (silicon oxide, silicon nitride, silicon oxynitride or the like) that is obtained by PCVD or coating. Here, an insulating film that is obtained by coating and is composed of skeleton by the bond of silicon (Si) and oxygen (O) is used.

Then, contact holes are formed in the first interlayer insulating film and the second interlayer insulating film 11 by using a mask, simultaneously with the removal of the interlayer insulating films on the periphery. Then, after removing the mask, a conductive film (sequentially stacked-layers of a TiN film, an Al(C+Ni) alloy film, and a TiN film) is formed, and another mask is formed to perform etching by use of the mask, thereby forming wirings (source and drain wirings of TFTs, a current supply line and the like). Note that the Al(C+Ni) alloy film is a material of which contact resistance to ITO or ITSO does not fluctuate much even after electric conduction or heat treatment is applied.

Then, the mask is removed, and a third interlayer insulating film 12 is formed. The third interlayer insulating film 12 is formed of an insulating film that is obtained by coating and is composed of skeleton formed by the bond of silicon (Si) and oxygen (O).

Then, by use of another mask, contact holes are formed in the third interlayer insulating film 12, simultaneously with the removal of the interlayer insulating film on the periphery.

Then, after removing the mask and depositing a light transmitting conductive film, patterning is performed with another mask, thereby obtaining a first electrode 13, a terminal electrode 27 and electrode patterns 25 and 26. Note that the electrode pattern 25 covers the edge of the interlayer insulating films, thereby blocking out the external moisture. Similarly, the electrode pattern 26 blocks out the external moisture. As the light transmitting conductive film, indium tin oxide (ITO) may be used as well as other light transmitting conductive materials such as indium tin oxide containing Si elements (ITSO), and IZO (Indium Zinc Oxide) that is obtained by mixing indium oxide with 2 to 20% of zinc oxide (ZnO). Note that the ITSO is a material that is not easily crystallized by electric conduction or heat treatment, and can provide a highly flat surface.

Then, the mask is removed, and a bank 19 is formed covering the end portion of the first electrode 13 by use of another mask. The bank 19 is formed of a photosensitive or non-photosensitive organic material (polyimide, acrylic, polyamide, polyimide amide, resist or benzocyclobutene), or an SOG film (for example, a $SiO_x$ film containing an alkyl group) with a thickness of 0.8 to 1 μm.

Then, an organic compound layer 14 is formed by deposition or coating.

Note that in order to improve the reliability of the light emitting element, vacuum heating is preferably carried out for degasification before the formation of the organic compound layer 14. For example, before depositing an organic compound material, heat treatment is desirably carried out at 200 to 300° C. in a low pressure atmosphere or an inert gas atmosphere in order to remove the gas contained in the substrate.

Then, a second electrode 15, namely a cathode of an organic light emitting element is formed with a thickness of 10 to 800 nm on the organic compound layer 14. The second electrode 15 may be formed by using a film that is obtained by an alloy such as MgAg, MgIn, and AlLi, $Ca_3N_2$, or co-evaporating aluminum and an element of the group 1 or 2 in the periodic law. Alternatively, the second electrode 15 may be formed by using an Al(C+Ni) alloy film where 0.3 atoms % of C and 3 atoms % of Ni are contained in Al. Note that the Al(C+Ni) alloy film is a material of which contact resistance to ITO or ITSO does not fluctuate much even after electric conduction or heat treatment is applied.

In this manner, a light emitting element and TFTs are manufactured. In order to obtain full color display, each material of an anode, an organic compound layer and a cathode for constituting a light emitting element for RGB is appropriately selected, and the thickness thereof is also controlled.

Then, a protective layer 16 for blocking out moisture is formed covering the light emitting element. The protective layer 16 can be formed by using a silicon nitride film, a silicon oxide film, a silicon oxynitride film (SiNO film (composition ratio N>O) or a SiON film (composition ratio N<O) each of which is obtained by sputtering or CVD, a thin film containing carbon as its main component (a DLC film or a CN film, for example) and the like.

Then, after segmenting the substrate into a desired size, a covering material 20 provided with a drying agent 18 is stuck to the substrate 10 to seal by use of a sealant 28 that contains a gap material for securing space (filler (fiber rod), fine particles (organosilica particles) and the like). The airtight space 17 surrounded by the sealant 28 is filled with a dry inert gas. The end portion of the covering material 20 covers the side face of the substrate 10. Further, the end portion of the covering material on the side provided with a terminal electrode is located in the position partially overlapping the driver circuit portion. Similarly, the sealant 28 is located in the position partially overlapping the driver circuit portion.

Finally, an FPC 32 is stuck to a terminal electrode 27 with an anisotropic conductive film 31 by a known method. The terminal electrode 27 is formed simultaneously with the first electrode 13. In addition, the terminal electrode 27 is located in the position partially overlapping the driver circuit portion.

The active matrix light emitting device manufactured in this manner is firmly sealed by the covering material 20, whereby the reliability of the light emitting device is improved.

In the light emitting device of the invention, driving method for image display is not specifically limited, and a dot-sequential driving method, a line-sequential driving method, a frame-sequential driving method and the like may be employed, for example. Typically, the line-sequential driving method is employed, however, a time-division gray scale driving method or an area gray scale driving method may also be used appropriately. In addition, video signals inputted to source lines of the light emitting device may be either analog signals or digital signals. A driver circuit and the like are may be designed in accordance with such video signals.

Further, a light emitting device having a digital video signal input is classified into the one where a video signal inputted to a pixel is constant voltage (CV) or constant current (CC). The light emitting device having a video signal input of the constant voltage (CV) is classified into the one where constant voltage is applied to a light emitting element (CVCV), and the one where constant current is applied to a light emitting element (CVCC). Meanwhile, the light emitting device having a video signal input of the constant current (CC) is classified into the one where constant voltage is applied to a light emitting element (CCCV), and the one where constant current is applied to a light emitting element (CCCC).

In addition, the light emitting device of the invention may be provided with a protection circuit (protection diode and the like) in order to prevent electrostatic discharge damage.

Further, a polarizer or a circular polarizer may be provided in order to enhance the contrast.

Embodiment Mode 2

Figure 5:
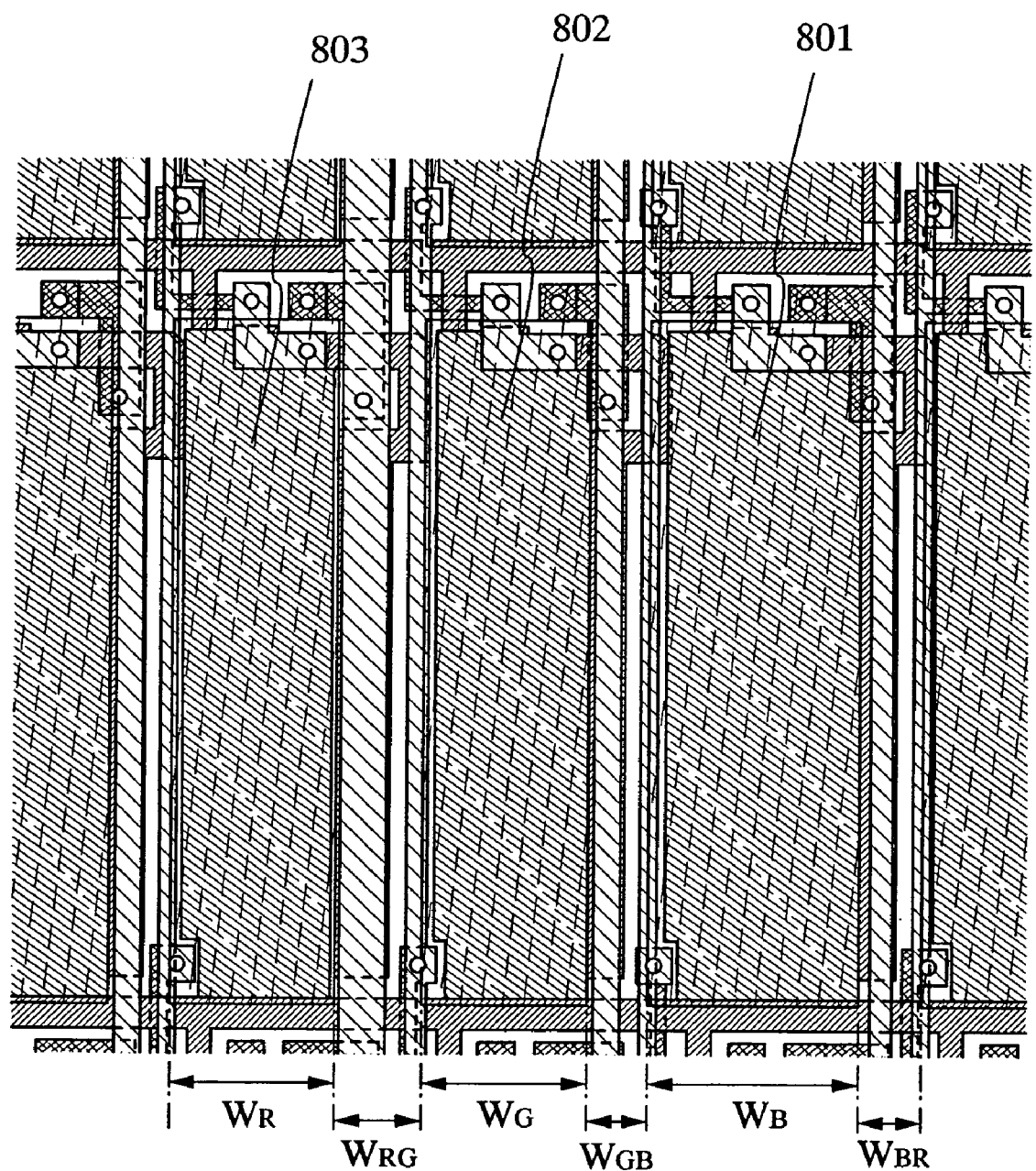
FIG. 5 illustrates a diagram of a pixel layout (Embodiment Mode 2).

FIG. 5 illustrates an example of a full color light emitting device where the reliability of RGB light emitting elements differs from each other. Here, only a light emitting area of a light emitting element that has lower reliability than the light emitting elements of the other colors is enlarged.

FIG. 5 is a layout where a plurality of light emitting elements each having stacked layers of a first electrode, an organic compound layer on the first electrode and a second electrode on the organic compound layer are arranged. FIG. 5 corresponds to the layout where the manufacture of a TFT and a first electrode is completed.

Figure 9A:
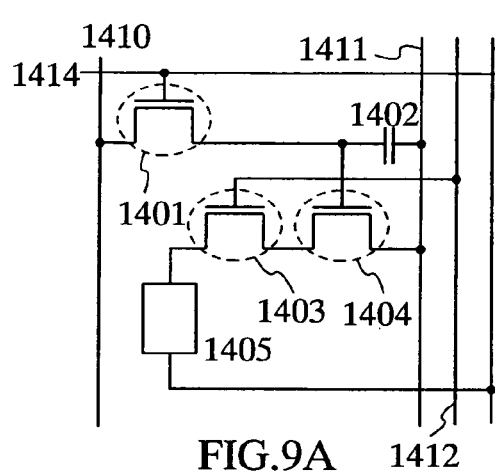
FIGS. 9A to 9F are circuit diagrams each illustrating a pixel configuration that can be applied to the EL display panel of the invention.
Figure 9B:
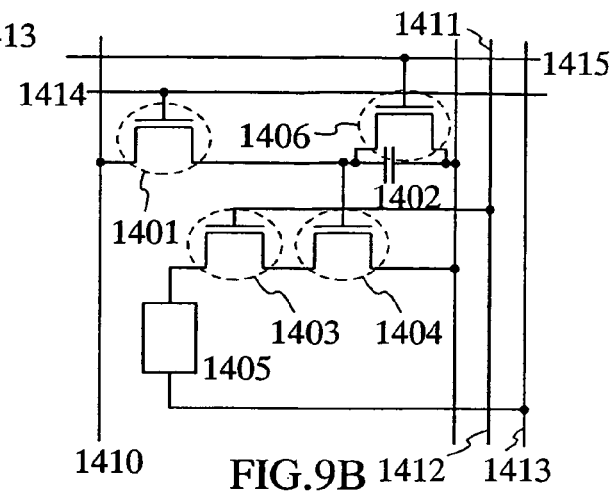
Figure 9C:
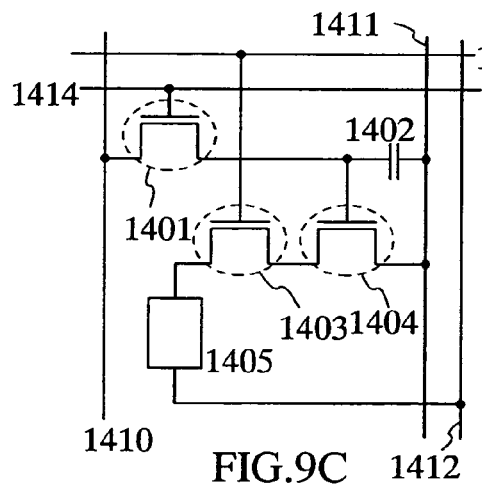
Figure 9D:
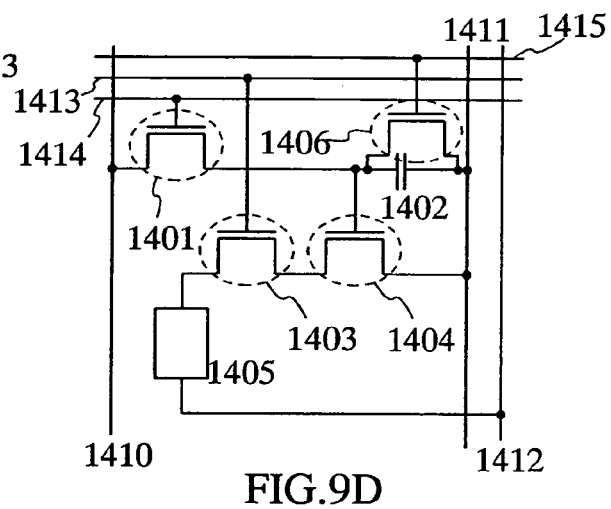
Figure 9E:
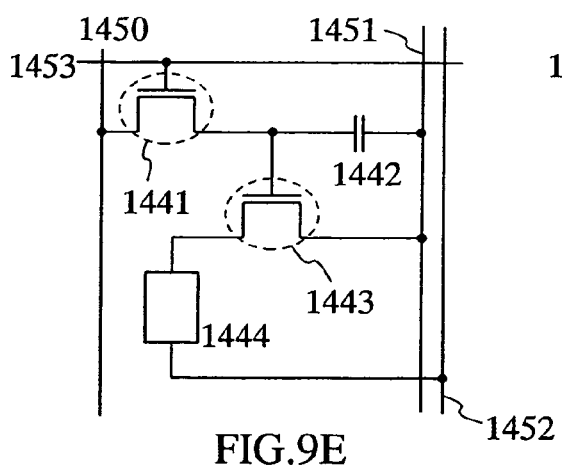

FIG. 9E corresponds to an equivalent circuit diagram of the pixel layout diagram shown in FIG. 5.

In FIG. 5, a first electrode 801 of a blue light emitting element is formed larger than a first electrode 802 of a green light emitting element and a first electrode 803 of a red light emitting element.

In addition, a bank covering the end portion of each first electrode is formed to have a different width so that the spacing between each first electrode differs from each other. For example, a spacing $W_{GB}$ between electrodes and a spacing $W_{BR}$ between electrodes are 15 μm each while a spacing $W_{RG}$ between electrodes is 20 μm.

In addition, a width $W_G$ of the first electrode 802 of the green light emitting element is identical to a width $W_R$ of the first electrode 803 of the red light emitting element, however, a width $W_B$ of the first electrode 801 of the blue light emitting element is wider than the others, resulting in an aperture rate of 64% per pixel as for the blue light emitting element. The aperture rate per pixel of the red light emitting element and the aperture rate per pixel of the green light emitting element are each 50%.

In this manner, the reliability of the light emitting device is improved by enlarging the light emitting area of only the blue light emitting element.

Note that a molecular exciton formed by an organic compound layer, which serves as a light emitting layer of a light emitting element, has the states of an excited singlet state and an excited triplet state. A ground state is typically the excited singlet state, therefore, light emission obtained from the excited singlet state is referred to as fluorescence while light emission obtained from the excited triplet state is referred to as phosphorescence.

For example, a film obtained by co-evaporating CBP (4,4'-bis(N-carbazolyl)biphenyl) and Ir(ppy)$_3$ (tris(2-phenylpyridinato-N,C$^{2'}$)iridium) is an organic compound that can obtain light emission (phosphorescence) from the excited triplet state (also referred to as a triplet compound). The light emission (phosphorescence) obtained from the excited triplet state exhibits higher luminous efficiency than the light emission (fluorescence) obtained from the excited singlet state, which makes it possible to reduce the operating voltage (voltage required for light emission of the organic light emitting element) that is required for obtaining the same luminance.

Light emission from the organic compound layer includes light obtained through either of the excited states. Further, fluorescence and phosphorescence may be combined, which can be selected based on the light emission characteristics of each RGB (luminous efficiency, life and the like). For example, such combination is possible that an organic compound that can obtain phosphorescence (triplet compound) is used for the light emitting layer of only the light emitting elements for G; while an organic compound that can obtain fluorescence (singlet compound) is used for the light emitting layer of the light emitting elements for B and R.

The organic compound layer has sequentially stacked layers of a HIL (Hole Injection Layer), a HTL (Hole Transporting Layer), an EML (light EMmiting Layer), an ETL (Electron Transporting Layer), and an EIL (Electron Injection Layer) from the first electrode side. Note that the organic compound layer may also have a single layer structure or a hybrid structure with an inorganic compound as well as the stacked-layer structure.

In addition, in the case of a full color display, the layer containing an organic compound may be selectively formed by deposition by use of an evaporation mask or ink-jetting, using materials for red (R), green (G) and blue (B) emission respectively.

Specifically, the HIL may be formed of CuPc (cupper phthalocyanine) or PEDOT (poly-ethylenedioxy-thiophene), the HTL may be formed of a-NPD (4,4'-[N-(1-naphthyl)-N-phenylamino]-biphenyl), the ETL may be formed of BCP (bathocuproine) or $Alq_3$ (tris(8-hydroxyquinolinato)aluminum), and the EIL may be formed of BCP:Li (lithium) or $CaF_2$ (calcium fluoride). As for the EML, for example, $Alq_3$ doped with dopant corresponding to each emission color of RGB (DCM (4-(dicyano-methylene)$_2$-methyl-6-(p-dimethyl-amino-styryl)-4H-pyran) and the like for R, and DMQD (N,N'-dimethylquinacridone) and the like for G) may be used. Note that the electroluminescent layer is not limited to the materials of the aforementioned stacked-layer structure. For example, in place of CuPc or PEDOT, an oxide such as molybdenum oxide ($MoO_x$: x=2 to 3) may be co-evaporated with a-NPD or rubrene in order to improve hole injection properties. For such materials, an organic material (including low and high molecular weight organic materials) or a composite material of an organic material and an inorganic material may be employed.

This embodiment mode can be freely implemented in combination with Embodiment Mode 1.

In regard to the invention having the aforementioned structures, description is made in further details in the embodiments below.

Embodiment 1

In this embodiment, description is made with reference to FIGS. 6A to 6I on the illustrative manufacturing steps of a semiconductor layer where crystallization of doping metal elements is performed, oxidation is performed by use of an ozone-containing solution, heat treatment is performed for reducing distortions, and then gettering is performed.

Figure 6A:
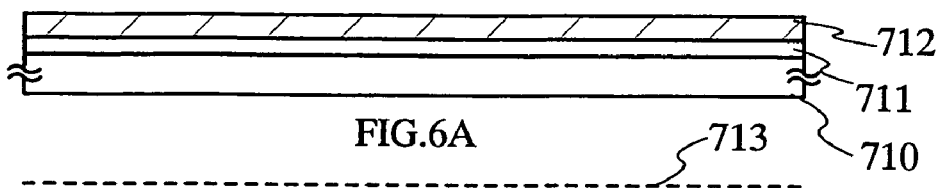
FIGS. 6A to 6I are cross-sectional views illustrating manufacturing steps of a semiconductor layer to serve as an active layer of a TFT (Embodiment 1).

In FIG. 6A, reference numeral 710 denotes a substrate having an insulating surface, 711 denotes an insulating film to serve as a blocking layer, and 712 denotes a semiconductor film having an amorphous structure.

First, as shown in FIG. 6A, the base insulating film 711 made of an insulating film such as a silicon oxide film, a silicon nitride film and a silicon oxynitride film ($SiO_xN_y$) is formed over the substrate 710.

Then, the first semiconductor film 712 having an amorphous structure is formed over the base insulating film. The first semiconductor film 712 is formed of a semiconductor material containing silicon as its main component. Typically, an amorphous silicon film or an amorphous silicon germanium film or the like is adopted, which is formed by plasma CVD, low pressure CVD or sputtering to have a thickness of 10 to 100 nm. In order to obtain a semiconductor film having a superior crystalline structure in the subsequent crystallization step, the first semiconductor film 712 having an amorphous structure is preferably set to contain less impurities such as oxygen and nitrogen down to a concentration of $5 \times 10^{18}/cm^3$ (atomic concentration measured by secondary ion mass spectrometry (SIMS)) or less. Such impurities will be the factor obstructive to the subsequent crystallization, and will also be the factor of the increase in density of a trapping center or a recombination center even after the crystallization. Therefore, it is desirable to use, not only a material gas of high purity, but also an ultra-high vacuum CVD apparatus having a chamber that is processed with mirror surface processing (polishing), and an oil-free type vacuum evacuation system.

Then, the first semiconductor film 712 having an amorphous structure is crystallized by using a technique disclosed in Japanese Patent Laid-Open No. Hei 8-78329. According to the technique disclosed in the patent publication, metal elements for promoting crystallization are selectively doped into an amorphous silicon film, and heat treatment is performed to obtain a semiconductor film having a crystalline structure starting from the doped region. This technique has an advantageous effect of decreasing a heating temperature necessary for crystallization as well as enhancing the crystal orientation in a single direction. When forming a TFT by using a semiconductor film having such a crystalline structure, not only the field effect mobility can be improved but also a sub-threshold factor (S value) can be decreased, which can drastically improve the electrical characteristics.

Figure 6B:
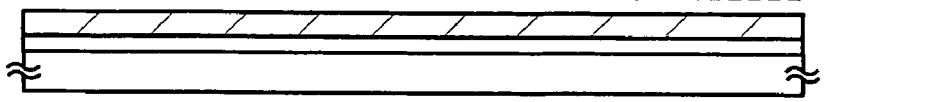

First, a nickel acetate solution containing metal elements having catalysis for promoting crystallization (nickel here) of 1 to 100 ppm in weight is coated using a spinner over the surface of the first semiconductor film 712 having an amorphous structure, thereby forming a nickel-containing layer 713 (FIG. 6B). As an alternative method for forming the nickel-containing layer 713 other than the coating, a method for forming an even thinner film by sputtering, deposition or plasma treatment may be employed. In addition, although the example shown here is the coating over the whole surface, the nickel-containing layer may be selectively formed by use of a mask.

Figure 6C:
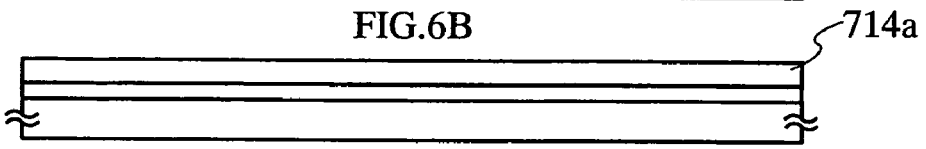

Then, heat treatment is performed for crystallization. In this case, a silicide is formed in a portion of the semiconductor film that is in contact with the metal elements for promoting crystallization of the semiconductor, and crystallization progresses by using the silicide as a nucleus. In this manner, a first semiconductor film 714a having a crystalline structure shown in FIG. 6C is obtained. Note that the concentration of oxygen contained in the first semiconductor film 714a after the crystallization is desirably $5 \times 10^{18}/cm^3$ or less. Here, after the heat treatment for dehydrogenation (450° C. for 1 hour), heat treatment for crystallization (550 to 650° C. for 4 to 24 hours) is performed. In the case of performing crystallization by using intense light irradiation, any one of infrared light, visible light and ultraviolet light, or combination of them may be used. Note that if necessary, heat treatment for discharging hydrogen contained in the first semiconductor film 714a having an amorphous structure may be performed before the intense light irradiation. Alternatively, heat treatment and intense light irradiation may be performed simultaneously for crystallization. In view of productivity, crystallization is desirably carried out by intense light irradiation.

In the first semiconductor film 714a obtained in such a manner, a metal element (nickel here) remains. Although it does not remain in the film uniformly, it remains at a concentration of over $1 \times 10^{19}/cm^3$ on average. Needless to say, various semiconductor elements such as TFTs can be formed even in such a state, however, the metal element is removed by gettering as described below.

Here, a natural oxide film formed in the crystallization step is removed before the laser irradiation. This natural oxide film contains a high concentration of nickel, therefore, it is preferably removed.

Figure 6D:
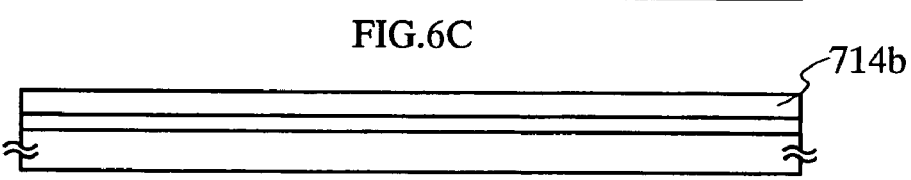

Then, in order to increase the degree of crystallization (degree of the crystallized component in the total volume of the film), and compensate defects remaining in the crystal grains, the first semiconductor film having a crystalline structure is irradiated with laser light (FIG. 6D). In the case of irradiating laser light, distortions or ridges are formed in a semiconductor film 714b, whereby a surface oxide film that is quite thin is formed on the surface (not shown). As the laser light for this case, excimer laser light having a wavelength of 400 nm or less that is emitted from a laser light source as a pulse oscillator, or the second or third harmonic of a YAG laser may be employed. Alternatively, the second to forth harmonics of the fundamental wave may be utilized by use of a solid-state laser capable of continuous oscillation. Typically, the second harmonic (532 nm) or the third harmonic (355 nm) obtained by a Nd:YVO$_4$ laser (fundamental wave: 1064 nm) is preferably employed.

The surface oxide film that can be obtained by laser irradiation is harder than an oxide film that is obtained by use of an ozone-containing aqueous solution, therefore, it is superior as an oxide film to serve as an etching stopper (barrier layer). Thus, the surface oxide film by laser light is not necessarily removed since the number of steps can be reduced accordingly.

Figure 6E:
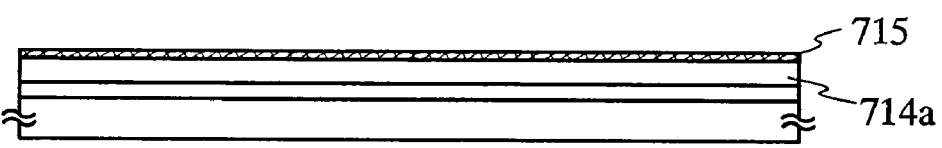

Then, an oxide film to serve as an etching stopper (referred to as a barrier layer) 715 is formed to have a thickness of 1 to 10 nm by using an ozone-containing aqueous solution over the surface of the semiconductor film 714b (FIG. 6E).

Figure 6F:
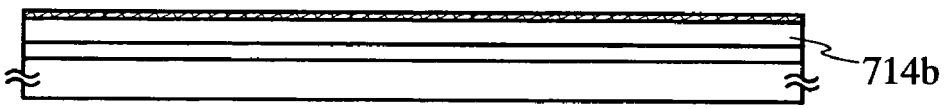

Then, heat treatment for decreasing distortions of the semiconductor film (heat treatment by which the semiconductor film is heated instantaneously up to around 400 to 1000° C.) is performed in a nitrogen atmosphere, thereby obtaining a semiconductor film 714c (FIG. 6F).

Figure 6G:
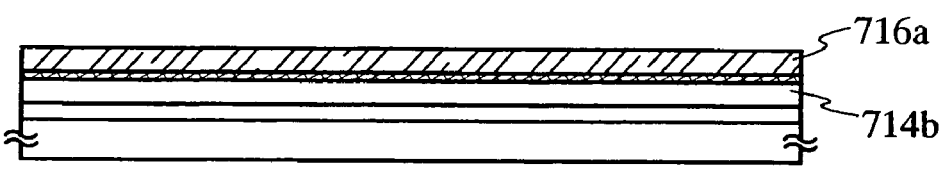

Then, a second semiconductor film 716a containing a noble gas element is formed over the barrier layer 715 (FIG. 6G). Note that the noble gas element is one or more elements selected from He, Ne, Ar, Kr and Xe. Among them, argon (Ar) that is a cheap gas is the most preferable in view of mass production. As a method for forming the second semiconductor film, sputtering or plasma CVD may be adopted, and the plasma CVD is particularly suitable in view of mass production since a deposition chamber (also referred to as a chamber) can be cleaned with a gas, which involves easier maintenance than the case of sputtering. In this embodiment, heat treatment is performed (heated instantaneously up to around 400 to 1000° C.) before or after the formation of the oxide film (barrier layer) to obtain a hard oxide film, thereby blocking damage by plasma and the like. By blocking the first semiconductor film while intentionally giving damage only to the oxide film (barrier layer) by using plasma generated at the film deposition in order to form distortions or dangling bonds in the oxide film (barrier film), metal elements that move in the direction to alleviate distortions can pass efficiently to get into the gettering site, and thus can be trapped. In the case of intentionally giving damage only to the oxide film (barrier layer) by use of the plasma generated at the film deposition, it is preferable to increase the RF power density by plasma CVD. For example, RF power of 300 W (0.052 W/cm$^2$), RF power of 400 W (0.069 W/cm$^2$), or 400 W or more is preferable.

Figure 6H:
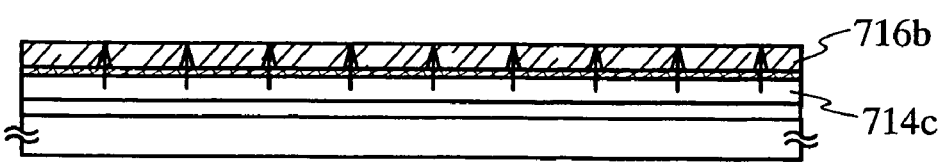

Subsequently, heat treatment is performed for gettering by decreasing the concentration of the metal elements (nickel) in the first semiconductor film, or removing the metal elements (FIG. 6H). As the heat treatment for gettering, there is the one using intense light irradiation, the one using a furnace, or the one where a substrate is put into a heated gas, and then it is taken out after being left for several minutes. According to such gettering, metal elements move in the direction of arrows in FIG. 6H (that is, the direction from the substrate to the surface of the second semiconductor film), whereby metal elements contained in a first semiconductor film 714d covered with barrier layer 715 are removed, or concentration thereof is reduced.

Then, only a second semiconductor film shown by 716b is selectively removed using the barrier layer 715 as an etching stopper. Then, the barrier layer 715 is removed.

Figure 6I:
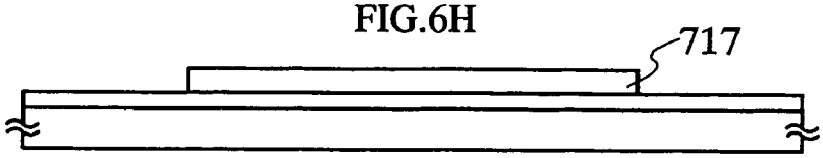

Subsequently, the first semiconductor film 714d is patterned by using a known patterning technique to obtain a semiconductor layer 717 with a desired shape (FIG. 6I). Note that after removal of the barrier layer and before formation of a resist mask, it is desirable to form a thin oxide film on the surface using ozone water.

Note also that if necessary, a slight amount of impurity elements (boron or phosphorous) are doped through the aforementioned oxide film before patterning is performed in order to control the threshold voltage of a TFT. If the doping is performed through the aforementioned oxide film, the oxide film is removed, and another oxide film is formed by using an ozone-containing aqueous solution again.

After the completion of a step of forming a semiconductor layer having a desired shape, the surface of the semiconductor layer is washed by etchant containing hydrofluoric acid, thereby forming an insulating film containing silicon as its main component, which serves as a gate insulating film. The surface washing and the formation of the gate insulating film are desirably carried out continuously without being exposed to the air. Then, the surface of the gate insulating film is washed, and a gate electrode is formed. Then, N-type impurity elements (P, As or the like), and P-type impurity elements (B or the like) are appropriately doped into the semiconductor layer, thereby forming a source region and a drain region. After the doping, heat treatment, intense light irradiation or laser irradiation is carried out for activating impurity elements. Simultaneously with the activation, plasma damage applied to the gate insulating film, or plasma damage applied to the boundary between the gate insulating film and the semiconductor layer can be restored. Subsequently, an interlayer insulating film is formed, hydrogenation is carried out, contact holes are formed to reach the source region and the drain region, and a conductive film is deposited to be patterned, thereby forming a source electrode or a drain electrode to complete a TFT. Note that each of the source electrode and the drain electrode is formed in single or multiple layers by using an element selected from Mo, Ta, W, Ti, Al and Cu, an alloy material or a compound material containing such element as its main component. For example, a three-layer structure of a Ti film, a pure Al film, and a Ti film, or a three-layer structure of a Ti film, an Al alloy film containing Ni and C, and a Ti film is employed. Further, taking into consideration an interlayer insulating film or the like that is formed in the subsequent step, a cross section of the electrode is desirably formed to have a taper shape.

A channel formation region of a TFT obtained in this manner is relatively flat, and distortions can thus be reduced. By using the thusly obtained TFT, a pixel portion and a driver circuit are constructed to complete a light emitting device. Note that the manufacture of a light emitting device can be carried out in accordance with Embodiment Mode 1.

In addition, if necessary, a low concentration drain (LDD: Lightly Doped Drain) structure may be provided where an LDD region is formed between a channel formation region and a drain region (or a source region). This structure is obtained by providing a region doped with impurity elements at a low concentration between a channel formation region and a source region or a drain region that is formed by doping impurity elements at a high concentration, and such a region is referred to as an LDD region. Further, a so-called GOLD (Gate-drain Overlapped LDD) structure may be provided where an LDD region overlaps a gate electrode with a gate insulating film sandwiched therebetween.

In the case of using crystallization in which metal elements are doped, gettering is not performed fully in the substrate. Variations in gettering lead to a slight difference, namely variations between the characteristics of each TFT. Thus, the step shown in this embodiment is effective. For a light emitting device using an organic compound layer as a light emitting layer (light emitting device comprising EL elements), TFTs are essential elements for realizing an active matrix driving method. Accordingly, in a light emitting device using EL elements, each pixel comprises at least a TFT functioning as a switching element, and a TFT for supplying current to an EL element. Luminance of a pixel is determined by on-current ($I_{on}$) of a TFT that is electrically connected to the EL element and supplies current to the EL element regardless of the circuit configuration of the pixel or the driving method. Therefore, when performing a white display on the whole screen, for example, luminance variations occur unless the on-current is constant.

In addition, the invention is not limited to the manufacturing steps shown in FIGS. 6A to 6I, and after the laser irradiation, for example, heat treatment may be performed to decrease distortions of the semiconductor film, and then an oxide film may be formed to have a thickness of 1 to 10 nm in total by using an ozone-containing aqueous solution. In addition, before removing the oxide film, heat treatment may be performed again for decreasing distortions of the semiconductor film, and after that, the obtained oxide film may be removed.

Alternatively, after the laser irradiation, the following steps may be sequentially performed: the semiconductor film is patterned; heat treatment is performed to decrease distortions of the semiconductor film; an oxide film is formed to have a thickness of 1 to 10 nm in total by using an ozone-containing aqueous solution; and the oxide film is removed. Note that in order to reduce the steps, a gate insulating film may be formed without removing the oxide film.

Further alternatively, after the laser irradiation, the following steps may be sequentially performed: the semiconductor film is patterned; an oxide film is formed to have a thickness of 1 to 10 nm by using an ozone-containing aqueous solution; heat treatment is performed to decrease distortions of the semiconductor film; and the oxide film is removed. Note that in order to reduce the steps, a gate insulating film may be formed without removing the oxide film.

This embodiment can be freely implemented in combination with Embodiment Mode 1 or Embodiment Mode 2.

Embodiment 2

In this embodiment, description is made on the example where FPCs and driver ICs are mounted on an EL display panel that is manufactured in accordance with the aforementioned embodiment.

Figure 7:
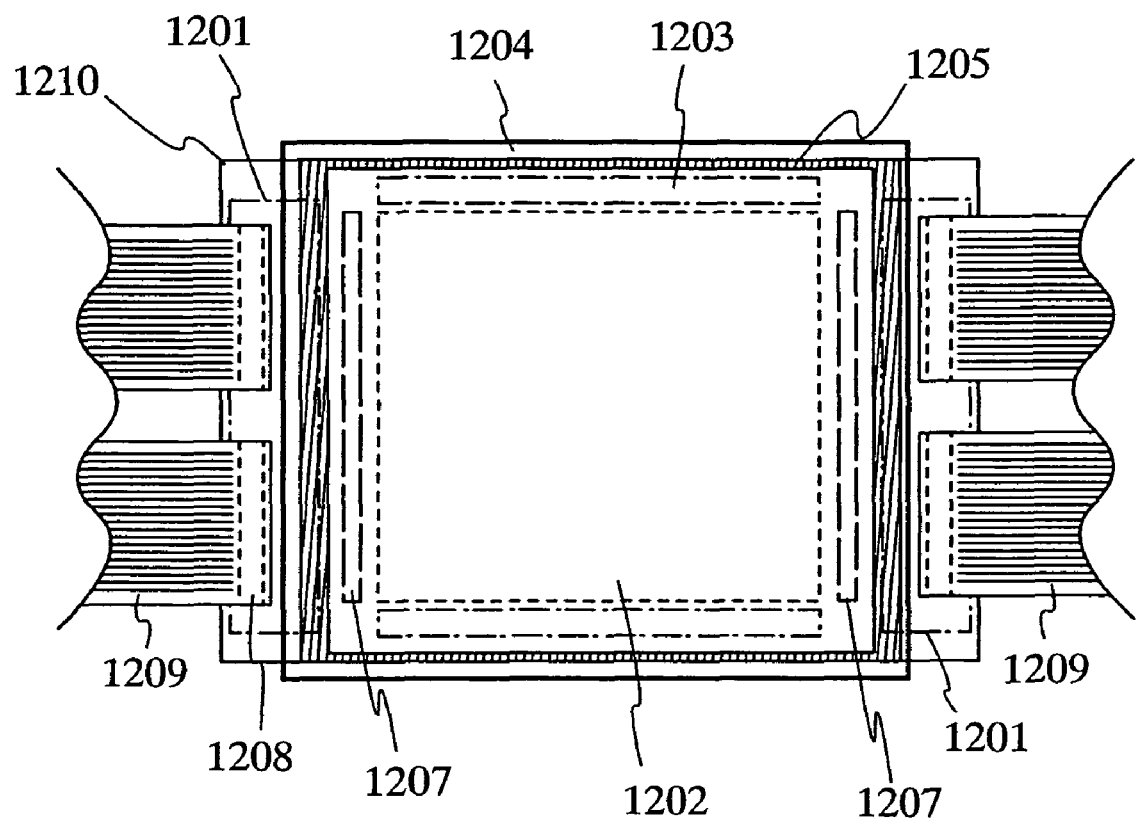
FIG. 7 illustrates a top view of a light emitting device (Embodiment 2).

FIG. 7 illustrates an exemplary top view of a light emitting device where FPCs 1209 are attached to four terminal portions 1208 respectively. On a substrate 1210, a pixel portion 1202 including light emitting elements and TFTs, a gate driver circuit 1203 including TFTs and a source driver circuit 1201 including TFTs are formed. In this embodiment, the terminal portions 1208 are formed in the position overlapping the source driver circuit 1201.

In the case where active layers of the TFTs are formed of semiconductor films having a crystalline structure, these circuits can be formed on a common substrate. Accordingly, an EL display panel that realizes system-on-panel can be manufactured.

In addition, connecting regions 1207 formed at the opposite sides of the pixel portion are provided in order to connect a second electrode of a light emitting element to a lower-layer wiring. Note that a first electrode of the light emitting element is electrically connected to a TFT provided in the pixel portion.

A covering material 1204 is fixed on the substrate 1210 with a sealant 1205 for surrounding the pixel portion 1202 and the connecting regions 1207. The sealant 1205 partially overlaps the source driver circuit 1201. In addition, a drying agent may be disposed in the region surrounded by the sealant 1205.

Figures 8A, 8B:
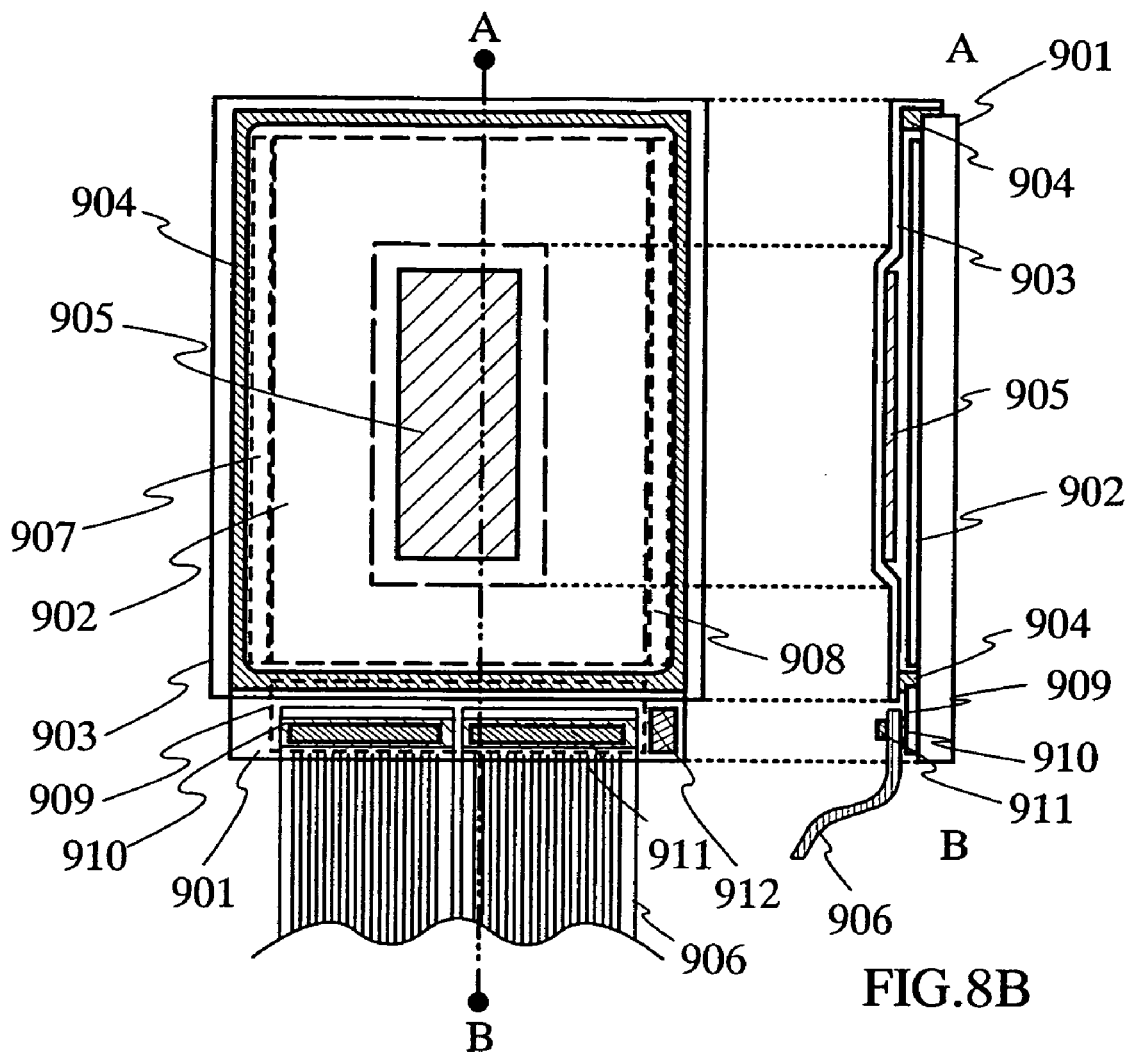
FIGS. 8A and 8B are a top view and a cross-sectional view of a light emitting device respectively (Embodiment 2).

FIGS. 8A and 8B are examples of a small-sized light emitting device (1.5 inches, for example) with a reduced frame portion where favorable COG bonding is adopted.

FIG. 8A illustrates a top view of a light emitting device, and FIG. 8B illustrates a cross-sectional view of FIG. 8A along a chain line A-B. A pixel portion 902 and a peripheral circuit portion 909 are formed on a common substrate, and a terminal electrode 910 for connection to an FPC 906 is provided above TFTs of the peripheral circuit portion. By disposing the terminal electrode 910 in the space where the peripheral circuit portion 909 is disposed, reduction in frame portion is achieved. A covering material 903 has a shape that covers three sides of a substrate 901, and in the three sides, a sealant 904 is provided on the edge of the substrate, whereby the space surrounded by the sealant is tightly sealed. The airtight space surrounded by the sealant 904 is filled with a nitrogen gas, and a slight amount of moisture therein is removed by a drying agent 905, whereby a sufficiently dried space is obtained.

In the light emitting device shown in FIGS. 8A and 8B, an IC chip 911 is mounted on the FPC 906. In the position where the IC chip 911 is mounted, the terminal electrode 910 is provided over the peripheral circuit portion 909, and the terminal electrode 910 is mounted on the FPC 906 with an anisotropic conductive adhesive material, on which the IC chip 911 is further stacked.

Also, on the substrate 901, an IC chip 912 is mounted by COG bonding. Note that the IC chips 911 and 912 are chips represented by a memory chip, a CPU chip, a power circuit chip and the like.

Note that each of the IC chips 911 and 912 may have a rectangular shape with its long side having 15 to 80 mm and short side having 1 to 6 mm in consideration of the length of one side of a pixel portion or the pixel pitch. Alternatively, the long side of each chip may be equal to one side of the pixel portion 902, or the total length of one side of the pixel portion and one side of each peripheral circuit.

This embodiment can be freely implemented in combination with Embodiment Mode 1, Embodiment Mode 2 or Embodiment 1.

Embodiment 3

In this embodiment, description is made on the configuration of a pixel of an EL display panel with reference to the equivalent circuit diagrams shown in FIGS. 9A to 9F.

A pixel shown in FIG. 9A comprises a signal line 1410 and power supply lines 1411 to 1413 in the column direction, and a scan line 1414 in the row direction. It also comprises a switching TFT 1401, a driving TFT 1403, a current controlling TFT 1404, a capacitor 1402 and a light emitting element 1405.

A pixel shown in FIG. 9C has the same configuration as the pixel shown in FIG. 9A except that the gate electrode of the TFT 1403 is connected to the power supply line 1413 disposed in the row direction. That is, the pixels shown in FIG. 9A and FIG. 9C are equivalent circuit diagrams. However, the power supply line 1413 is each formed by using a conductive layer of the different layer in the case where the power supply line 1413 is disposed in the row direction (FIG. 9A) and the case where the power supply line 1413 is disposed in the column direction (FIG. 9C). Here, a wiring for connecting the gate electrode of the driving TFT 1403 is focused on, and description is made separately in FIG. 9A and FIG. 9C in order to make a distinction between the layers for forming the respective wirings.

In the pixels shown in FIG. 9A and FIG. 9C, the TFTs 1403 and 1404 are connected in series, and a channel length $L_3$ and a channel width $W_3$ of the TFT 1403, and a channel length $L_4$ and a channel width $W_4$ of the TFT 1404 are set to satisfy: $L_3/W_3$: $L_4/W_4$=5 to 6000:1. As an example for satisfying 6000:1, such case is considered that $L_3$ is 500 μm, $W_3$ is 3 μm, $L_4$ is 3 μm, and $W_4$ is 100 μm.

Note that the TFT 1403 operates in the saturation region, and functions to control the current value supplied to the light emitting element 1405 while the TFT 1404 operates in the linear region, and functions to control a current supply to the light emitting element 1405. Both TFTs preferably have the same conductivity in terms of the manufacturing steps. In addition, the TFT 1403 may be a depletion mode TFT as well as an enhancement mode TFT. According to such a configuration, the TFT 1404 operates in the linear region. Therefore, slight fluctuations of $V_{GS}$ of the TFT 1404 do not affect the current value of the light emitting element 1405. That is, the current value of the light emitting element 1405 is determined by the TFT 1403 that operates in the saturation region. According to such a configuration, a display device can be provided where luminance unevenness of light emitting elements caused by the characteristic variations of TFTs is improved to enhance the image quality.

In the pixels shown in FIGS. 9A to 9D, the TFT 1401 controls a video signal input to the pixel. When the TFT 1401 is turned ON and a video signal is inputted to the pixel, the video signal is stored in the capacitor 1402. Note that FIGS. 9A and 9C each illustrates the configuration providing the capacitor 1402, however, the invention is not limited to this, and the capacitor 1402 may be omitted when the gate capacitance and the like can substitute the capacitor for storing video signals.

A pixel shown in FIG. 9B has the same pixel configuration as FIG. 9A except that a TFT 1406 and a scan line 1415 are additionally provided. Similarly, a pixel shown in FIG. 9D has the same pixel configuration as FIG. 9C except that the TFT 1406 and the scan line 1415 are additionally provided.

ON/OFF of the TFT 1406 is controlled by the scan line 1415 that is provided additionally. When the TFT 1406 is turned ON, charge stored in the capacitor 1402 is released, thereby turning OFF the TFT 1406. That is, the provision of the TFT 1406 makes it possible to obtain a state where the light emitting element 1405 is forcibly suspended from a current supply. Thus, in the configurations in FIGS. 9B and 9D, lighting periods can start simultaneously with or immediately after the writing period without awaiting the completion of signal writing to the whole pixels, which can improve the duty ratio.

A pixel shown in FIG. 9E comprises a signal line 1450 and power supply lines 1451 and 1452 in the column direction, and a scan line 1453 in the row direction. It also comprises a switching TFT 1441, a driving TFT 1443, a capacitor 1442 and a light emitting element 1444.

The circuit diagram shown in FIG. 9E corresponds to the pixel layout diagram shown in FIG. 5.

Figure 9F:
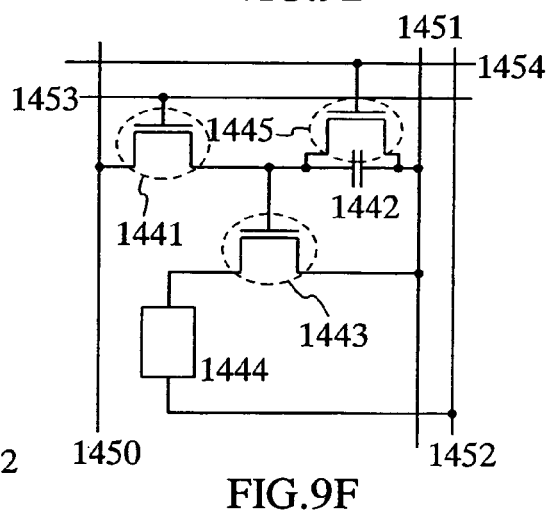

A pixel shown in FIG. 9F has the same pixel configuration as FIG. 9E except that a TFT 1445 and a scan line 1454 are additionally provided. Note that the configuration of FIG. 9F can also improve the duty ratio by providing the TFT 1445.

This embodiment can be freely implemented in combination with Embodiment Mode 1, Embodiment Mode 2, Embodiment 1 or Embodiment 2.

Embodiment 4

The invention is not limited to a TFT whose active layer is formed of a semiconductor film having a crystalline structure, and a TFT whose active layer is formed of an amorphous semiconductor film or a semi-amorphous semiconductor film may be utilized. Further, the invention can be applied to any TFT structures. For example, it may be applied to a bottom gate (inversely staggered) TFT or a staggered TFT.

An amorphous semiconductor is formed by plasma CVD, sputtering or the like. When adopting a TFT whose active layer is formed of an amorphous semiconductor, a bottom gate TFT may be formed, and both of a scan line driver circuit and a signal line driver circuit may be mounted by using driver ICs.

A semi-amorphous semiconductor can be formed by plasma CVD at a temperature of 300° C. or less, and it can be formed in a shorter time to have an enough thickness to obtain a transistor even when using a non-alkaline glass substrate with an external size of 550×650 nm, for example. Such a manufacturing technique is effective in manufacturing a display device with a large screen. In addition, a semi-amorphous TFT whose channel formation region is formed of a semi-amorphous semiconductor film (also referred to as a micro-crystalline semiconductor film) can exhibit field effect of mobility of 2 to 10 cm$^2$/V·sec. Accordingly, such a TFT can be used as a switching element in a pixel or an element that constitutes a scan line driver circuit. Thus, an EL display panel or a liquid crystal display panel that realizes a system-on-panel can be manufactured.

Figure 10:
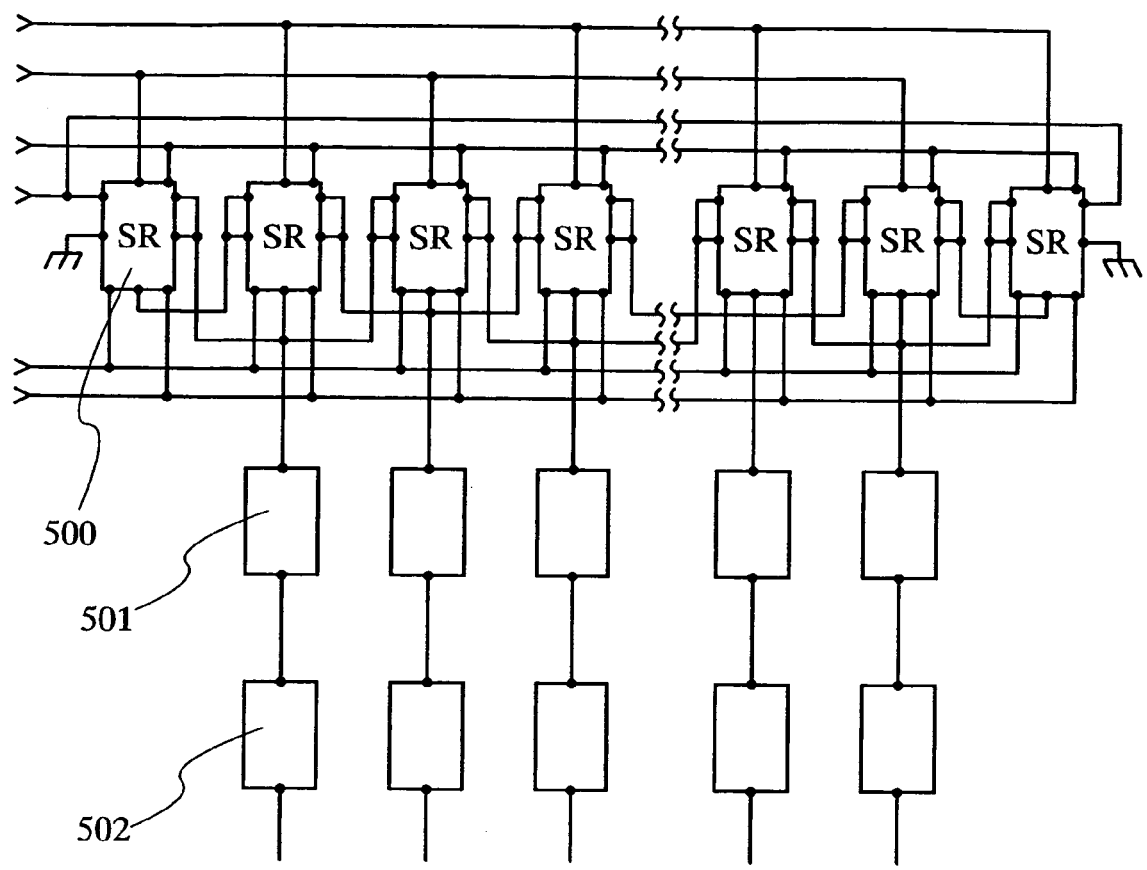
FIG. 10 is a diagram illustrating a circuit configuration in the case where a scan line driver circuit is formed by using TFTs according to the invention.
Figure 11:
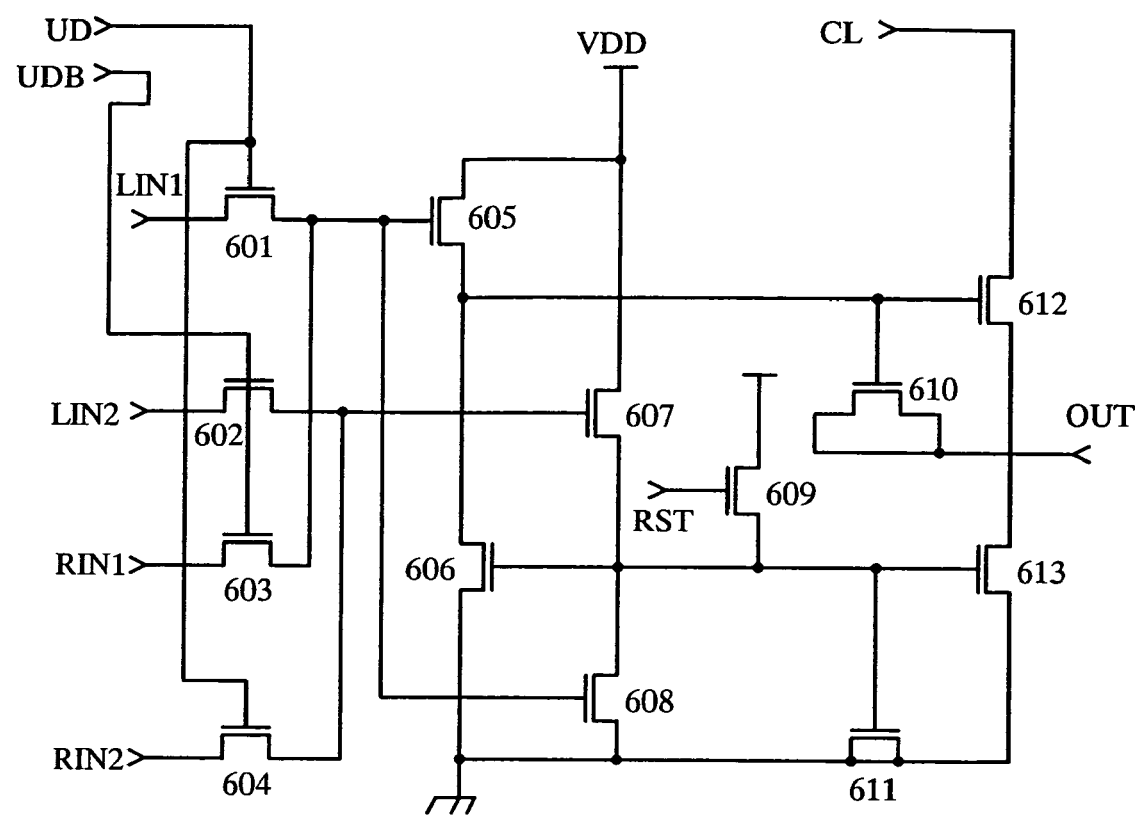
FIG. 11 is a diagram illustrating a circuit configuration in the case where a scan line driver circuit is formed by using TFTs according to the invention (shift register circuit).
Figure 12:
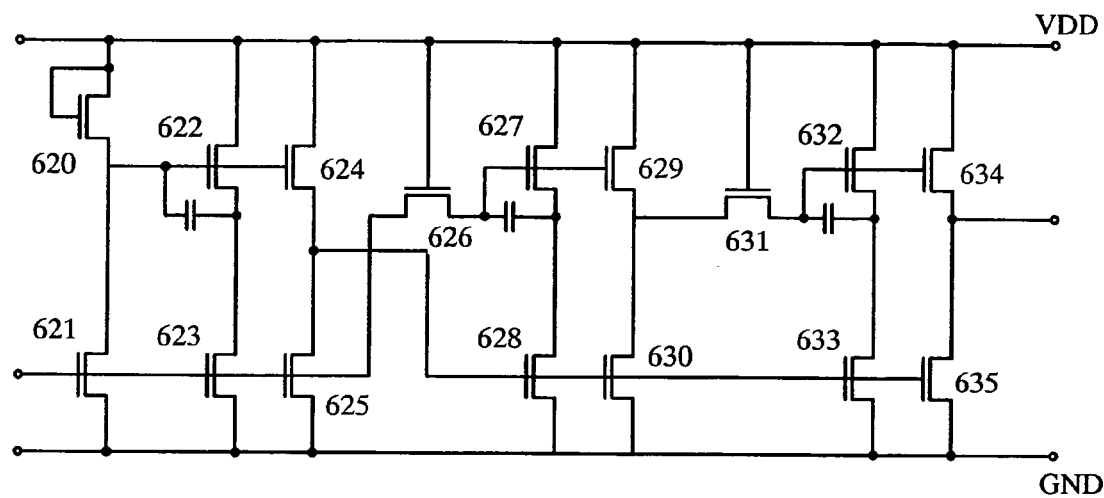
FIG. 12 is a diagram illustrating a circuit configuration in the case where a scan line driver circuit is formed by using TFTs according to the invention (buffer circuit).

In this embodiment, description is made with reference to FIGS. 10, 11 and 12 on an example of forming a scan line driver circuit and a pixel portion on a common substrate by forming a semiconductor layer using a semi-amorphous semiconductor film.

FIG. 10 illustrates a block diagram of a scan line driver circuit constructed by N-channel TFTs each using a semi-amorphous semiconductor film that can exhibit field effect mobility of 1 to 15 cm$^2$/V·sec.

In FIG. 10, reference numeral 500 denotes a pulse output circuit for outputting sampling pulses for one stage, and a shift register is constructed by n pulse output circuits. Reference numeral 501 denotes a buffer circuit, and an end portion thereof is connected to a pixel 502.

FIG. 11 illustrates a specific configuration of the pulse output circuit 500, which comprises N-channel TFTs 601 to 612. The size of the TFTs may be determined in consideration of the operating characteristics of the N-channel TFTs that use semi-amorphous semiconductor films. For example, when setting the channel length at 8 μm, the channel width can be selected from the range of 10 to 80 μm.

FIG. 12 illustrates a specific configuration of the buffer circuit 501. The buffer circuit is also constructed by N-channel TFTs 620 to 636. The size of the TFTs may be determined in consideration of the operating characteristics of the N-channel TFTs that use semi-amorphous semiconductor films. For example, when setting the channel length at 10 μm, the channel width can be selected from the range of 10 to 1800 μm.

This embodiment can be freely implemented in combination with Embodiment Mode 1, Embodiment Mode 2, Embodiment 1, Embodiment 2 or Embodiment 3.

Embodiment 5

Examples of the light emitting device and the electronic apparatus of the invention include a video camera, a digital camera, a goggle display (head mounted display), a navigation system, a sound reproducing device (e.g., a car audio and a component stereo set), a laptop personal computer, a game machine, a portable information terminal (e.g., a mobile computer, a portable phone, a portable game machine and an electronic book), an image reproducing device provided with a recording medium (specifically, a device for reproducing a recording medium such as a Digital Versatile Disc (DVD), and having a display screen for displaying the reproduced image), and the like. FIGS. 13A and 13B, and 14A to 14E illustrate specific examples of such electronic apparatuses.

Figure 13A:
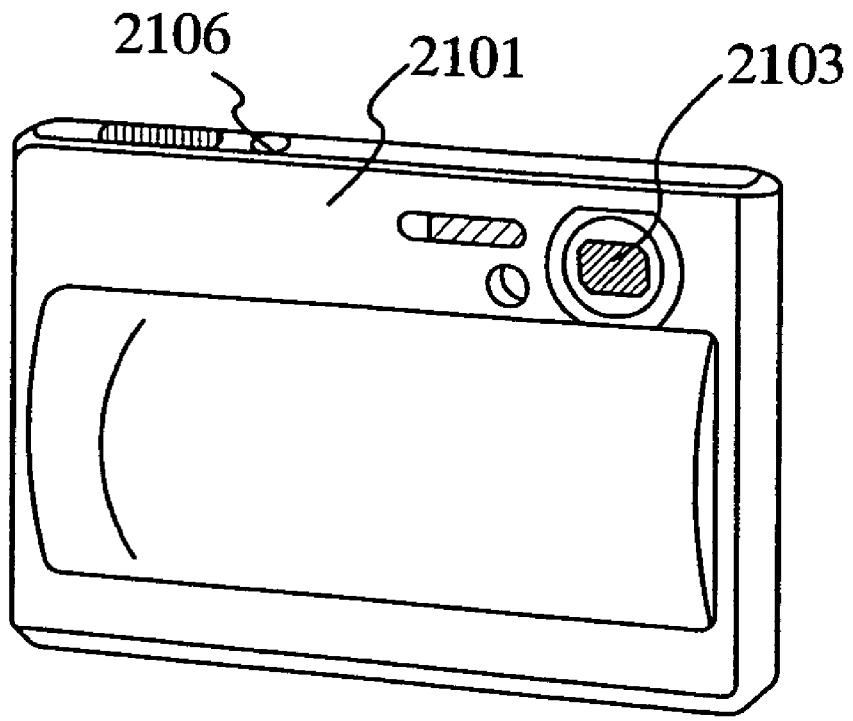
FIGS. 13A and 13B illustrate examples of an electronic apparatus.
Figure 13B:
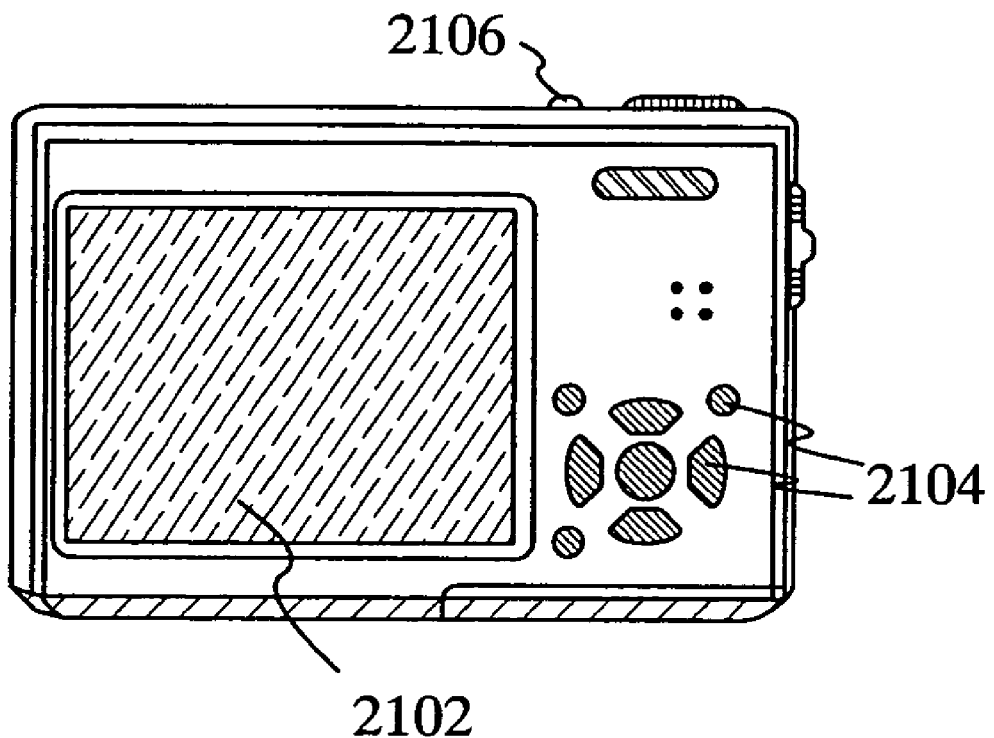

FIGS. 13A and 13B illustrate a digital camera that includes a main body 2101, a display portion 2102, an image pick-up portion 2103, operating keys 2104, a shutter 2106 and the like. According to the invention, a digital camera can be provided at lower manufacturing cost with higher yield and reliability.

Figure 14A:
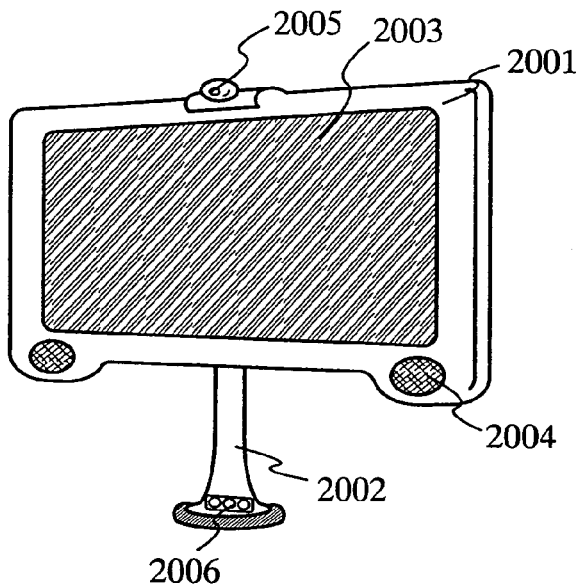
FIGS. 14A to 14E illustrate examples of an electronic apparatus.

FIG. 14A illustrates a large-sized display device having a large screen of 22 inches to 50 inches, which includes a housing 2001, a supporting base 2002, a display portion 2203, a speaker portion 2004, an image pick-up portion 2005, a video input terminal 2006 and the like. Note that the display device includes all information display devices including those for personal computers, TV broadcast reception and the like. According to the invention, a large-sized display device can be provided at lower manufacturing cost with higher yield and reliability.

Figure 14B:
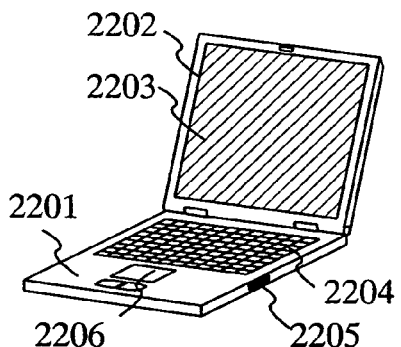

FIG. 14B illustrates a laptop personal computer that includes a main body 2201, a housing 2202, a display portion 2203, a key board 2204, an external connecting port 2205, a pointing mouse 2206 and the like. According to the invention, a laptop personal computer can be provided at lower manufacturing cost with higher yield and reliability.

Figure 14C:
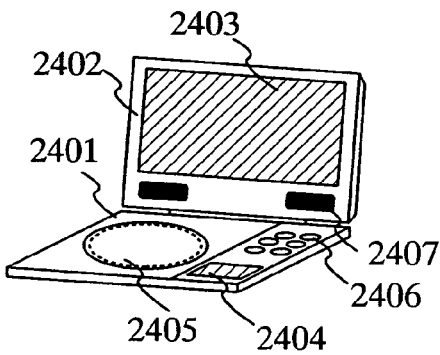

FIG. 14C illustrates a portable image reproducing device provided with a recording medium (specifically, a DVD reproducing device), which includes a main body 2401, a housing 2402, a display portion A 2403, a display portion B 2404, a recording medium (DVD and the like) reading portion 2405, an operating key 2406, a speaker portion 2407 and the like. The display portion A 2403 mainly displays image data while the display portion B 2404 mainly displays text data. Note that the image reproducing device provided with a recording medium includes a home game machine and the like. According to the invention, an image reproducing device can be provided at lower manufacturing cost with higher yield and reliability.

Figure 14D:
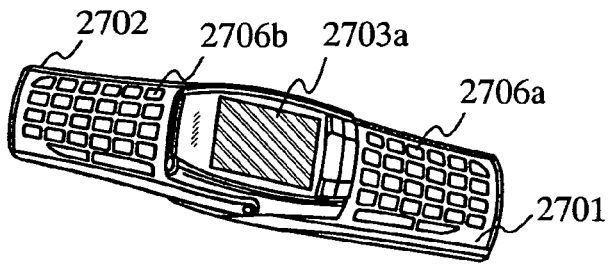
Figure 14E:
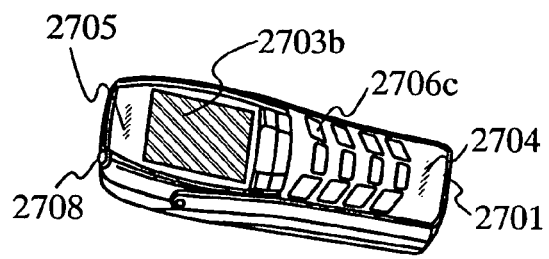

FIG. 14D is a perspective view of a portable information terminal, and FIG. 14E is a perspective view thereof illustrating the usage as a portable phone while being folded. In FIG. 14D, a user operates an operating key 2706a with his right finger like a keyboard while operates an operating key 2706b with his left finger. According to the invention, a portable information terminal can be provided at lower manufacturing cost with higher yield and reliability.

As shown in FIG. 14E, when the portable information terminal is folded, a main body 2701 and a housing 2701 are held by one hand, and an audio input portion 2704, an audio output portion 2705, an operating key 2706c, an antenna 2708 and the like are operated.

Note that the portable information terminal shown in FIGS. 14D and 14E comprises a high-image-quality display portion 2703a for mainly displaying images and text horizontally, and a display portion 2703b for displaying vertically.

As set forth above, various electronic apparatuses can be completed by using any of the manufacturing methods or the structures described in Embodiment Mode 1, Embodiment Mode 2, and Embodiments 1 to 4.

According to the invention, further reduction in frame portion can be achieved while the number of panels taken out from one substrate can be increased. By increasing the number of panels taken out from one substrate, manufacturing cost of one panel can be reduced. The present application is based on Japanese Priority application No. 2004-121121 filed on Apr. 16, 2004 with the Japanese Patent Office, the entire contents of which are hereby incorporated by reference.

What is claimed is:

1. A light emitting device comprising:
   a substrate;
   a pixel portion over the substrate, the pixel portion comprising a light emitting element including a first electrode, a film containing an organic compound over the first electrode and a second electrode over the film containing the organic compound;
   a driver circuit portion for controlling the pixel portion over the substrate, the driver circuit portion comprising a thin film transistor;
   a terminal electrode over the substrate with the thin film transistor interposed therebetween, the terminal electrode electrically connected to the driver circuit portion; and
   an FPC over the substrate with the terminal electrode and the thin film transistor interposed therebetween, the FPC electrically connected to the terminal electrode,
   wherein the terminal electrode is formed of a same material as the first electrode.

2. A light emitting device comprising:
   a substrate;
   a pixel portion over the substrate, the pixel portion comprising a light emitting element including a first electrode, a film containing an organic compound over the first electrode and a second electrode over the film containing the organic compound;
   a driver circuit portion for controlling the pixel portion over the substrate, the driver circuit portion comprising a thin film transistor;
   a terminal electrode over the substrate with the thin film transistor interposed therebetween, the terminal electrode electrically connected to the driver circuit portion;
   an FPC over the substrate with the terminal electrode and the thin film transistor interposed therebetween, the FPC electrically connected to the terminal electrode; and
   a covering material covering at least the pixel portion,
   wherein the covering material is fixed to the substrate by a sealant and a portion of the covering material covers a lateral side surface of the substrate with a portion of the sealant interposed therebetween, and wherein the terminal electrode is formed of a same material as the first electrode.

3. A light emitting device comprising:
a pixel portion over a substrate, the pixel portion comprising:
a first light emitting element including a pixel for red emission;
a second light emitting element including a pixel for green emission;
a third light emitting element including a pixel for blue emission;
each of the first, second, third light emitting elements each including a first electrode, a film containing an organic compound over the first electrode and a second electrode over the film containing the organic compound,
wherein the first electrode of the third light emitting element has a larger area than those of the first light emitting element and the second light emitting element,
a driver circuit portion for controlling the pixel for red emission, the pixel for green emission and the pixel for blue emission over the substrate, the driver circuit portion comprising a thin film transistor;
a terminal electrode over the substrate with the thin film transistor interposed therebetween, the terminal electrode electrically connected to the driver circuit portion; and
an FPC over the substrate with the terminal electrode and the thin film transistor interposed therebetween, the FPC electrically connected to the terminal electrode,
wherein the terminal electrode is formed of a same material as the first electrode.

4. A light emitting device comprising:
a substrate;
a pixel portion over the substrate comprising a light emitting element including a first electrode, a film containing an organic compound over the first electrode and a second electrode over the film containing the organic compound;
a driver circuit portion for controlling the pixel portion over the substrate, the driver circuit portion comprising a thin film transistor;
a terminal electrode over the substrate with the thin film transistor interposed therebetween, the terminal electrode electrically connected to the driver circuit portion;
an FPC over the substrate with the terminal electrode and the thin film transistor interposed therebetween, the FPC electrically connected to the terminal electrode; and
a covering material covering at least the pixel portion,
wherein the covering material is fixed to the substrate by a sealant and a portion of the covering material covers a lateral side surface of the substrate with a portion of the sealant interposed therebetween,
wherein a portion of the covering material overlaps at least a part of the driver circuit portion and a portion of the sealant overlaps at least a part of the driver circuit portion, and
wherein the terminal electrode is formed of a same material as the first electrode.

5. The light emitting device according to claim 1, wherein a covering material is fixed to the substrate by a sealant.

6. The light emitting device according to claim 3, wherein a covering material is fixed to the substrate by a sealant.

7. The light emitting device according to claim 5, wherein a drying agent is disposed in an airtight space surrounded by the sealant.

8. The light emitting device according to claim 2, wherein a drying agent is disposed in an airtight space surrounded by the sealant.

9. The light emitting device according to claim 6, wherein a drying agent is disposed in an airtight space surrounded by the sealant.

10. The light emitting device according to claim 4, wherein a drying agent is disposed in an airtight space surrounded by the sealant.

11. An electronic apparatus according to claim 1, wherein the light emitting device is a video camera, a digital camera, a personal computer or a portable information terminal.

12. An electronic apparatus according to claim 11, wherein the portable information terminal is a mobile computer, a portable phone, a portable game machine or an electronic book.

13. An electronic apparatus according to claim 2, wherein the light emitting device is a video camera, a digital camera, a personal computer or a portable information terminal.

14. An electronic apparatus according to claim 13, wherein the portable information terminal is a mobile computer, a portable phone, a portable game machine or an electronic book.

15. An electronic apparatus according to claim 3, wherein the light emitting device is a video camera, a digital camera, a personal computer or a portable information terminal.

16. An electronic apparatus according to claim 15, wherein the portable information terminal is a mobile computer, a portable phone, a portable game machine or an electronic book.

17. An electronic apparatus according to claim 4, wherein the light emitting device is a video camera, a digital camera, a personal computer or a portable information terminal.

18. An electronic apparatus according to claim 17, wherein the portable information terminal is a mobile computer, a portable phone, a portable game machine or an electronic book.

19. An electronic apparatus according to claim 1, wherein the first electrode and the terminal electrode are at least selected from group consisting of indium tin oxide, indium tin oxide containing silicon element, and indium zinc oxide.

20. An electronic apparatus according to claim 2, wherein the first electrode and the terminal electrode are at least selected from group consisting of indium tin oxide, indium tin oxide containing silicon element, and indium zinc oxide.

21. An electronic apparatus according to claim 3, wherein the first electrode are at least selected from group consisting of indium tin oxide, indium tin oxide containing silicon element, and indium zinc oxide.

22. An electronic apparatus according to claim 4, wherein the first electrode and the terminal electrode are at least selected from group consisting of indium tin oxide, indium tin oxide containing silicon element, and indium zinc oxide.

* * * * *